United States Patent

Ushiroku et al.

[11] Patent Number: 6,137,380
[45] Date of Patent: *Oct. 24, 2000

[54] SURFACE ACOUSTIC WAVE FILTER UTILIZING A PARTICULARLY PLACED SPURIOUS COMPONENT OF A PARALLEL RESONATOR

[75] Inventors: Tadamasa Ushiroku; Norio Taniguchi, both of Ishikawa-ken, Japan

[73] Assignee: Murata Manufacturing, Co., Ltd, Kyoto, Japan

[*] Notice: This patent is subject to a terminal disclaimer.

[21] Appl. No.: 09/030,045

[22] Filed: Feb. 24, 1998

Related U.S. Application Data

[63] Continuation-in-part of application No. 08/696,602, Aug. 14, 1996, Pat. No. 5,831,493.

[30] Foreign Application Priority Data

Feb. 17, 1998 [JP] Japan ................... 10-035175

[51] Int. Cl.[7] ................... H03H 9/64
[52] U.S. Cl. ................... 333/193; 333/195; 310/313 D
[58] Field of Search ................... 333/193–196; 310/313 R, 313 B, 313 C, 313 D

[56] References Cited

U.S. PATENT DOCUMENTS

| | | | |
|---|---|---|---|
| 4,635,009 | 1/1987 | Ebata | 310/313 D X |
| 5,459,368 | 10/1995 | Onishi et al. | 310/344 X |
| 5,631,515 | 5/1997 | Mineyoshi et al. | 310/313 D X |
| 5,666,092 | 9/1997 | Yamamoto et al. | 310/313 D X |
| 5,729,186 | 3/1998 | Seki et al. | 333/194 |
| 5,831,493 | 11/1998 | Ushiroku | 333/193 |

FOREIGN PATENT DOCUMENTS

| | | | |
|---|---|---|---|
| 56-19765 | 8/1981 | Japan . | |
| 5-183380 | 7/1993 | Japan . | |
| 6-152317 | 5/1994 | Japan | 333/193 |
| 6-338756 | 12/1994 | Japan . | |

*Primary Examiner*—Robert Pascal
*Assistant Examiner*—Barbara Summons
*Attorney, Agent, or Firm*—Keating & Bennett, LLP

[57] ABSTRACT

A surface acoustic wave filter significantly improves attenuation in the stopband by using a spurious component to improve the filter characteristics. The filter includes a surface acoustic wave substrate and a series resonator having a resonant frequency and an antiresonant frequency. The series resonator is electrically disposed between an input terminal and an output terminal in series so as to define a series arm. The filter also includes at least one parallel resonator having a resonant frequency and an antiresonant frequency which is substantially identical to the resonant frequency of the series resonator. The at least one parallel resonator is electrically disposed between the series arm and a ground terminal so as to define a first parallel arm. The series arm and the parallel arm define a ladder circuit such that the surface acoustic wave filter has a predetermined pass band. The first parallel resonator has a spurious component at a frequency located between the resonant frequency of the first parallel resonator and a low end of the passband of the surface acoustic wave filter or at a frequency located between the antiresonant frequency of the series resonator and a high end of the passband of the surface acoustic wave filter.

20 Claims, 29 Drawing Sheets

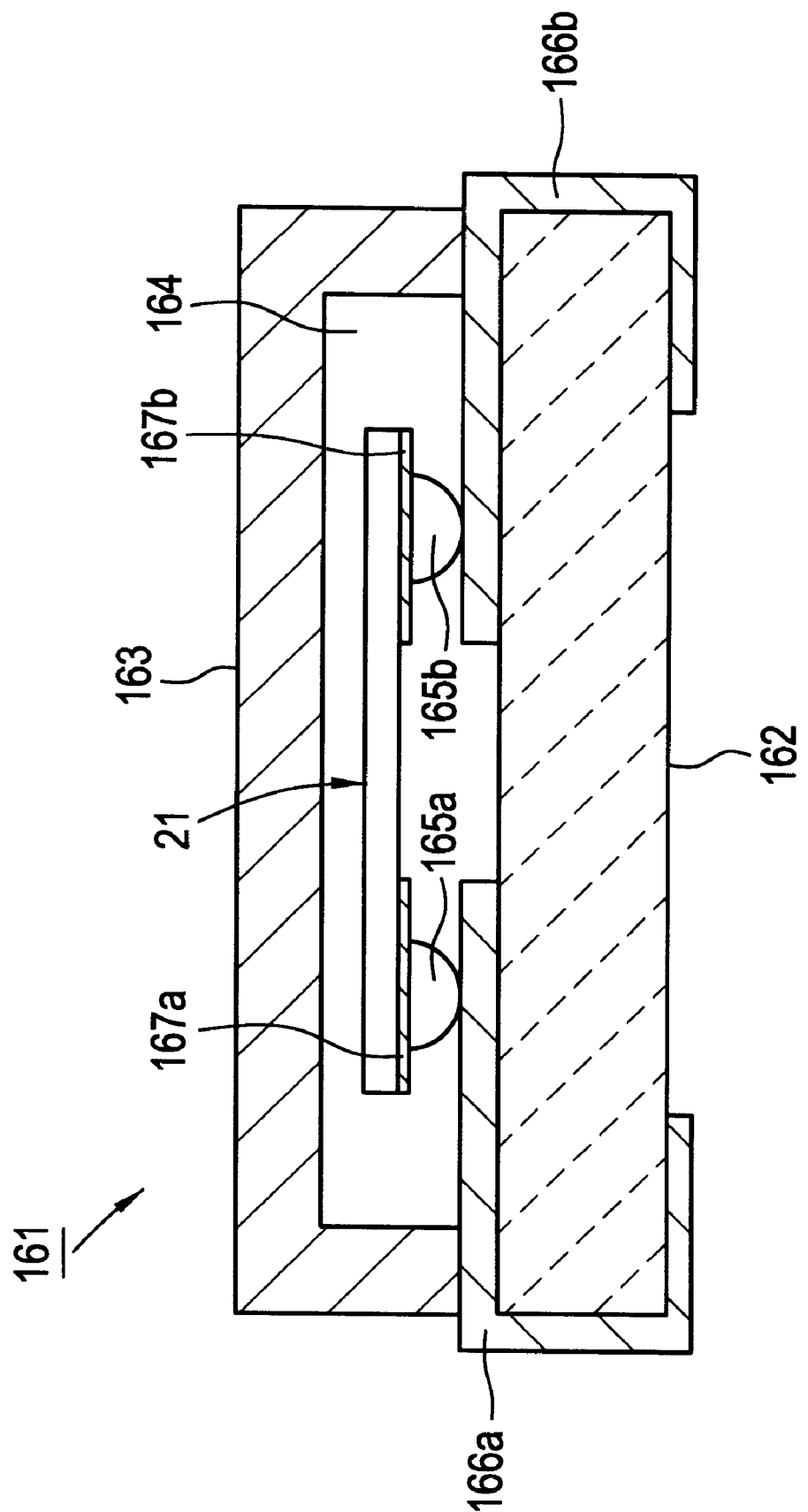

SURFACE ACOUSTIC WAVE FILTER UTILIZING A PARTICULARLY PLACED SPURIOUS COMPONENT OF A PARALLEL RESONATOR

This application is a Continuation-in-Part of U.S. patent application Ser. No. 08/696,602, filed Aug. 14, 1996 now U.S. Pat. No. 5,831,493.

BACKGROUND OF THE INVENTION

1. Field of the Invention

The present invention relates to a band-pass surface acoustic wave (SAW) filter including a plurality of SAW resonators and, more particularly, to a SAW filter including a plurality of SAW resonators arranged in a ladder type circuit.

2. Description of the Related Art

A SAW filter having a plurality of SAW resonators arranged so as to define a ladder circuit is disclosed, for example, in Japanese Laid-open Patent Publication Nos. 56-19765 and 5-183380. A SAW filter of this type is now described by referring to FIG. 1.

The SAW filter generally indicated by reference numeral 1 in FIG. 1 includes various electrodes arranged on a rectangular piezoelectric substrate 2 to form a plurality of SAW resonators. In particular, series resonators 3 and 4 each formed of a one-port SAW resonator are connected in series between an input terminal IN and an output terminal OUT. Two parallel arms are located between the input terminal and a reference potential and between the output terminal and the ground potential, respectively, and parallel resonators 5 and 6 each including a one-port SAW resonator are located in the parallel arms.

The resonators 3, 4, 5 and 6 comprise interdigital transducers (IDTs) 3a, 4a, 5a and 6a and grating type reflectors 3b, 3c, 4b, 4c, 5b, 5c, 6b and 6c located on respective opposite sides of a SAW propagating direction.

Each of the IDTs 3a to 6a includes a pair of interdigitated electrodes. One interdigitated electrode of the IDT 3a is electrically connected with the input terminal IN, while the other interdigitated electrode of the IDT 3a is connected with one interdigitated electrode of the IDT 5a and with one interdigitated electrode of the IDT 4a by a connecting electrode 7. The other interdigitated electrode of the IDT 4a is electrically connected with the output terminal OUT and with one interdigitated electrode of the IDT 6a by a connecting electrode 8.

One interdigitated electrode of each of the IDTs 5a and 6a is coupled to a ground potential. Accordingly, in the surface acoustic wave filter 1, the series resonators 3 and 4 are connected in series between the input terminal IN and the output terminal OUT to form the series arm. The two parallel arms are formed between the series arm and the ground potential. In each of these two parallel arms, the parallel resonators 5 and 6 are connected, thus forming a ladder circuit.

The IDTs 3a to 6a and the grating type reflectors 3b, 3c, 4b, 4c, 5b, 5c, 6b, 6c are formed of aluminum or other metal on the piezoelectric substrate 2, together with the connecting electrodes 7 and 8. In the SAW filter 1, the resonant frequency of the SAW resonators 3 and 4 is set to be equal to the antiresonant frequency of the SAW resonators 5 and 6. As a result, the whole SAW filter 1 can exhibit band-pass filter characteristics, which will be described with reference to FIGS. 2 and 3.

FIG. 2 is a plan view schematically showing the electrode structure of each one-port SAW resonator similar to that used to form the resonators 3–6 in FIG. 1. In a SAW resonator 9, an IDT 10 including of a pair of interdigitated electrodes 10a and 10b is located at a central portion of the resonator. The electrodes 10a and 10b are arranged to be interdigitated with each other. Reflectors 11 and 12 are located on opposite sides of the SAW propagation direction in which a surface acoustic wave propagates. The reflectors 11 and 12 comprise a plurality of electrode fingers extending perpendicular to the SAW propagation direction. Both ends of each of the electrode fingers of the reflectors 11, 12 are connected with the ends of other electrode fingers at their respective ends.

When a voltage is applied between the interdigitated electrodes 10a and 10b of the IDT 10, a surface acoustic wave is excited. The excited wave is confined between the reflectors 11 and 12. Hence, a resonator having a high Q can be achieved.

The SAW resonator 9 described above is indicated by a circuit symbol shown in FIG. 3A and has an impedance-frequency characteristic shown in FIG. 3B. As shown in FIG. 3B, the impedance is low near a resonant frequency $f_r$ and is very high at an antiresonant frequency $f_a$. Therefore, when the SAW resonator 9 and similar SAW resonators are connected in a ladder circuit similar to the SAW resonators 3 to 6 connected as shown in FIG. 1, if the resonant frequency of the series resonators is set to be equal to the antiresonant frequency of the parallel resonators, the input/output impedance can be matched to the characteristic impedance in the vicinity of this frequency. Thus, a passband can be formed.

FIGS. 3C and 3D respectively show a circuit diagram and an impedance-frequency characteristic of the SAW filter 1. Referring to FIG. 3C, when a signal is input to the input terminal IN, the signal component at the resonant frequency $f_{rs}$ of the series resonators 3 and 4 can be transmitted to the output terminal OUT through the series resonators 3 and 4. In that case, the signal component at the resonant frequency $f_{rs}$ is not transmitted to the ground since the parallel resonators 5 and 6 have a high impedance at the antiresonant frequency $f_{ap}$ which is set to be equal to the resonant frequency $f_{rs}$ of the series resonators 3 and 4. On the other hand, the signal component at the antiresonant frequency $f_{as}$ of the series resonators 3 and 4 is blocked by the series resonators 3 and 4. The signal component at the resonant frequency $f_{rp}$ of the parallel resonators 5 is transmitted to the ground potential because of the low impedance at the resonant frequency $f_{rp}$. Consequently, the signal component does not reach the output terminal OUT.

Accordingly, the impedance-frequency characteristics shown in FIG. 3D are obtained. As shown in FIG. 3D, attenuation poles are formed at the vicinity of the antiresonant frequency $f_{as}$ of the series resonators and the resonant frequency $f_{rp}$ of the parallel resonators. It is noted that a passband PB is defined as a frequency range at which attenuation is within 3 dB (or 6 dB) with respect to the center frequency of the filter or a minimum insertion loss. A stopband SB is also defined as a frequency range at which attenuation is within 20 dB (or 40 dB) with respect to the center frequency of the filter or a minimum insertion loss.

According to the aforementioned description of the conventional device, such a SAW filter is arranged to have a band-pass filter characteristic which provides low insertion loss and large attenuation in a stopband at the vicinity of the passband.

The band-pass filter characteristic of the aforementioned SAW filter 1 may be sufficient to provide the filter characteristics for a band-pass filter which were required several years ago. However, in recent years, the interval between the transmission frequency and the reception frequency has become very close in a communications device such as a cellular mobile telephone to enhance the efficiency of utilization of electromagnetic waves. Therefore, the SAW filter 1 does not always provide sufficient selectivity. Thus, the inventors have determined that there is a need for a band-pass filter having a steeper filtering characteristic curve or frequency response between a passband and a stopband as compared to presently available devices.

In order to increase the sharpness or steepness of the frequency response (attenuating characteristic) between the passband and stopband, it is conventionally thought that a general method in which the number of resonators is increased to increase the total number of the resonator stages should be used. A resonator stage comprises a pair of series and parallel SAW resonators. However, when the number of stages is increased, the electrode resistance is undesirably increased in proportion to the number of resonators. This leads to a deterioration of the insertion loss for the filter. Furthermore, the process of arranging the increased number of electrodes on the piezoelectric substrate becomes much more complicated, which in turn renders the manufacturing and assembling process more complex and also increases the size of the piezoelectric substrate and overall filter. In this way, limitations are imposed on the filter design and manufacturing method which includes increasing the number of stages. For the foregoing reasons, the inventors have determined that there is a demand for a SAW filter which achieves a steeper frequency response at an interface between a passband and a stopband without increasing the number of the stages in the SAW filter.

SUMMARY OF THE INVENTION

To overcome the problems described above, the preferred embodiments of the present invention provide a surface acoustic wave device which has significantly improved attenuation in a stopband of the filter.

Further, the preferred embodiments of the present invention provide a surface acoustic wave filter which provides increased attenuation and an improved frequency-response.

In addition, the preferred embodiments of the present invention provide a surface acoustic wave filter which includes a series resonator and a parallel resonator and which is arranged to produce a spurious component at a specific frequency which is located between the resonant frequency of the parallel resonator and a low end of a passband of the surface acoustic wave filter or at a frequency located between an antiresonant frequency of the series resonator and a high end of the passband of the surface acoustic wave filter. The location and advantageous usage of this spurious component produces a significantly increased steepness of the frequency response and increases the amount of attenuation in the passband.

According to a preferred embodiment of the present invention, a surface acoustic wave filter includes a surface acoustic wave substrate, an input terminal, an output terminal, a ground terminal, a series resonator disposed on the surface acoustic wave substrate and having a resonant frequency and an antiresonant frequency, the series resonator being electrically disposed between the input terminal and the output terminal in series so as to define a series arm, and a first parallel resonator disposed on the surface acoustic wave substrate having a resonant frequency and an antiresonant frequency which is substantially identical to the resonant frequency of the series resonator, the first parallel resonator being electrically disposed between the series arm and a ground terminal so as to define a first parallel arm, the series arm and the first parallel arm constituting a ladder circuit such that the surface acoustic wave filter has a predetermined pass band, wherein the first parallel resonator has a spurious component at a frequency located between the resonant frequency of the first parallel resonator and a low end of the passband of the surface acoustic wave filter or at a frequency located between the antiresonant frequency of the series resonator and a high end of the passband of the surface acoustic wave filter.

The generation and location of the spurious component at the specific desired frequency can be achieved by setting a distance r between a reflector and an IDT of the parallel resonator to be less than $0.5\lambda$ or greater than $0.5\lambda$, where $\lambda$ is a wavelength of a surface acoustic wave generated in the surface acoustic wave substrate.

In addition, the steepness of the frequency response can be increased by arranging a width of the electrode finger of the interdigital transducer which is closest to the reflector to be less than that of the remaining electrode fingers of the interdigital transducer or reflector of the parallel resonator.

Furthermore, the frequency response can be improved by arranging a pitch between the electrode fingers of the reflector to be less than that of the interdigital transducer so that the spurious component is located outside of a stopband of the reflector of the parallel resonator.

The surface acoustic wave filter according to the preferred embodiments of the present invention may be provided in a package which encases the surface acoustic wave substrate. Such a package includes a plurality of electrodes disposed on the package and a plurality of bonding wires. The plurality of the electrode fingers of the parallel resonator constitute a pair of interdigitated electrodes, and one of the interdigitated electrodes is electrically connected to at least one of the electrodes on the package through the bonding wires.

For the purpose of illustrating the invention, there is shown in the drawings several forms which are presently preferred, it being understood, however, that the invention is not limited to the precise arrangements and instrumentalities shown.

BRIEF DESCRIPTION OF THE DRAWINGS

FIG. 41 is a cross sectional view of a SAW filter device according to a tenth preferred embodiment.

DETAILED DESCRIPTION OF PREFERRED EMBODIMENTS

Preferred embodiments of the present invention are explained in detail in the following paragraphs with reference to the drawings attached hereto.

Figure 4:
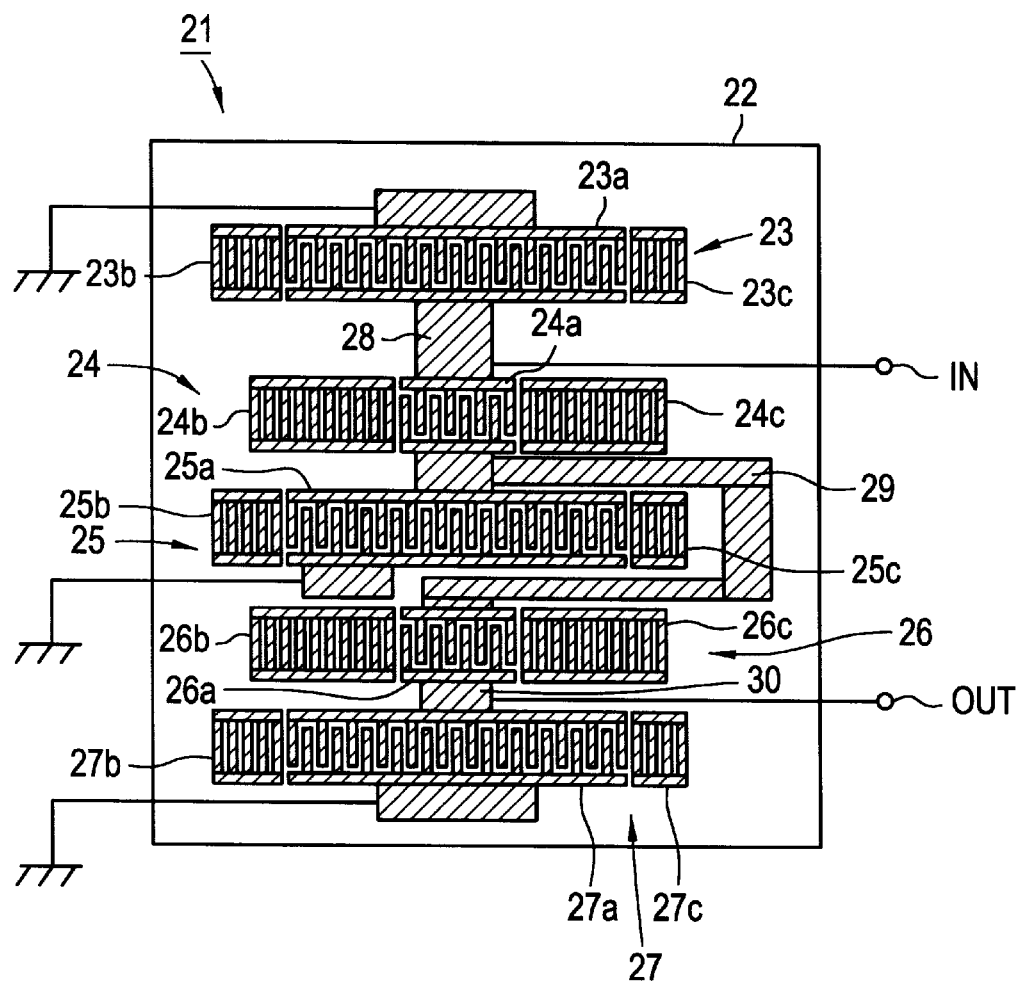
FIG. 4 is a schematic plan view of a SAW filter according to a first preferred embodiment of the invention.
Figure 5:
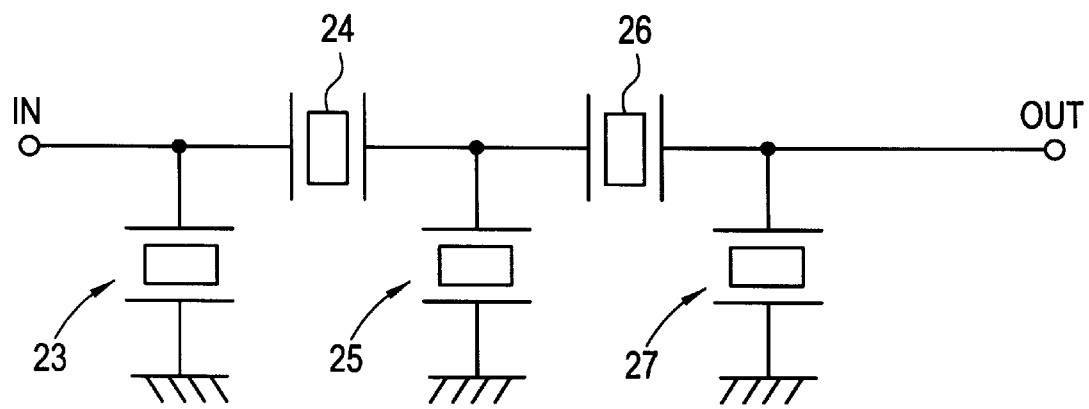
FIG. 5 is a circuit diagram of the SAW filter shown in FIG. 4.

FIGS. 4 and 5 are a schematic plan view and an equivalent circuit diagram of a SAW (surface acoustic wave) filter according to a first preferred embodiment of the present invention, respectively. The SAW filter, generally indicated by reference numeral 21, includes a substantially rectangular surface acoustic wave substrate 22. In the present preferred embodiment, the SAW substrate 22 is preferably a 36°-rotated, Y-cut piezoelectric plate made of $LiTaO_3$.

Series resonators 24 and 26 and parallel resonators 23, 25 and 27 are arranged on the substrate 22. The resonators 23, 24, 25, 26, 27 include IDTs 23a, 24a, 25a, 26a and 27a and grating-type reflectors 23b, 23c, 24b, 24c, 25b, 25c, 26b, 26c, 27b and 27c, respectively. The reflectors 23b, 23c, 24b, 24c, 25b, 25c, 26b, 26c, 27b and 27c are located on the opposite sides of IDTs 23a to 27a in a SAW propagation direction, respectively.

The SAW filter 21 is connected with an input terminal IN and with an output terminal OUT. The series resonators 24 and 26 are connected in series between the input terminal IN and output terminal OUT, thus defining a series arm. The parallel resonators 23, 25, and 27 are connected between the series arm and a reference potential, thus each forming a parallel arm.

Each of the IDTs 23a to 27a includes a pair of interdigitated electrodes. One interdigitated electrode of the IDT 23a of the parallel resonator 23 is electrically connected to one interdigitated electrode of the IDT 24a of the series resonator 24 by a connecting electrode 28. Another connecting electrode 29 electrically connects the other interdigitated electrode of the IDT 24a to one interdigitated electrode of the IDT 25a and to one interdigitated electrode of the IDT 26a. A further connecting electrode 30 electrically connects the other interdigitated electrode of the IDT 26a to one interdigitated electrode of the IDT 27a.

The other interdigitated electrodes of the IDTs 23a, 25a, and 27a are connected with the ground potential. Therefore, the SAW filter 21 is designed to have a ladder circuit configuration shown in FIG. 5.

The SAW resonators 23 to 27 and the electrodes including the connecting electrodes 28 to 30 can be formed of a metal material such as aluminum on the substrate 22 by an appropriate method. For instance, aluminum may be deposited over the substrate 22, and the aluminum layer may be patterned by a photolithography technology so as to form the electrode structure shown in FIG. 4. Alternatively, a conductive material such as aluminum may be deposited on the substrate 22, using a mask, by evaporation, sputtering, or other method to form the electrode structure.

The electrode structure of the resonators 23 to 27, i.e., the number of the interdigital electrodes and their lengths, are only schematically shown in FIG. 4. In practice, the SAW resonators 23–27 are preferably designed using parameters as listed in Table 1 below.

TABLE 1

| Resonator | Number of electrode fingers in Reflector | Number of IDT pairs | Overlap width | IDT wavelength | IDT-reflector distance |
|---|---|---|---|---|---|
| SAW resonator 23, 27 | 100 | 50 | 60 | 4.303 | 0.46λ |
| SAW resonator 24, 26 | 100 | 50 | 50 | 4.142 | 0.5λ |
| SAW resonator 25 | 50 | 120 | 120 | 4.327 | 0.43λ |

The antiresonant frequency $f_{rp}$ of the parallel resonators 23, 25, 27 is preferably set so as to be substantially equal to the resonant frequency $f_{rs}$ of the series resonators 24, 26. Therefore, the SAW filter 21 operates as a band-pass filter, since the filter has the ladder circuit configuration shown in FIG. 5.

In each of the resonators 23 to 27, the distance between each IDT and the adjacent reflector is preferably set in accordance with the characteristics contained in Table 1. More specifically, the distance between each IDT and the adjacent reflector is preferably set so as to be less than about 0.5λ in the parallel resonators 23, 25 and 27 while the distance between each IDT and the adjacent reflector is preferably set to be about 0.5λ in the series resonators 24 and 26.

This arrangement produces a spurious component in the parallel resonators 23, 25, 27 so as to be located between the resonant frequency of the resonators 23, 25, 27 and the lower end of passband of the SAW filter 21. As a result of this spurious component being located in the specific frequency location described above, the frequency response is made sufficiently steep between the lower end of the passband and the end of the stopband. This will be described in further detail below.

Figure 6:
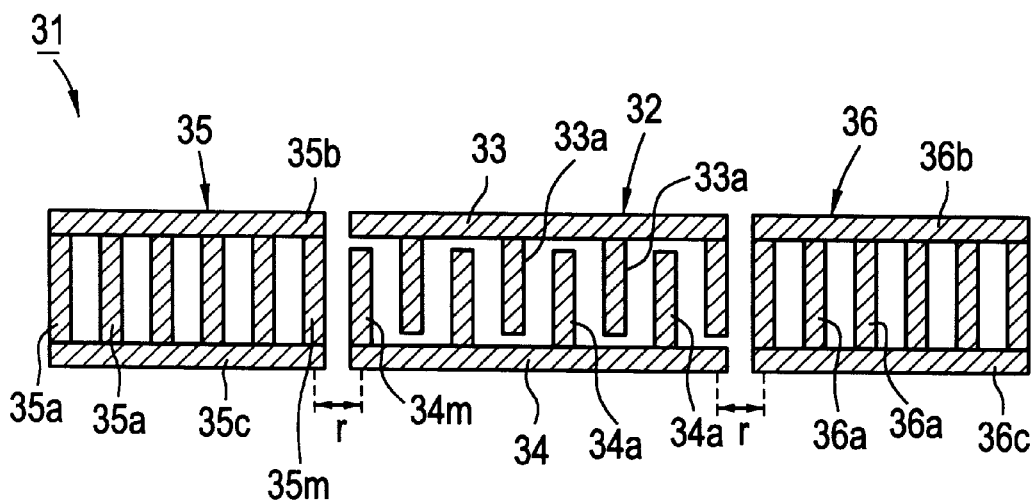
FIG. 6 is a plan view schematically showing an electrode structure of a one-port SAW resonator used in the SAW filter shown in FIG. 4.

FIG. 6 is a plan view schematically showing one example of the SAW resonators used as a parallel resonator in this preferred embodiment. The SAW resonator, generally indicated by reference numeral 31, has an IDT 32 located at a central portion thereof. The IDT 32 includes a pair of interdigitated electrodes 33 and 34 having a plurality of electrode fingers 33a and 34a, respectively. The electrode fingers 33a and 34a are interdigitated with each other. In the IDT 32, the distance between the centers of the electrode fingers 33a and 34a (pitch of the electrode fingers 33a and 34a) is preferably set to be about 0.5λ, where λ is the wavelength of the surface wave excited in the SAW resonator.

Reflectors 35 and 36 are mounted on the opposite sides of the IDT 32 and include electrode fingers 35a and 36a, respectively. Both ends of the electrode fingers 35a are connected to each other by common electrodes 35b and 35c. Similarly, both ends of the electrode fingers 36a are connected to each other by common electrodes 36b and 36c. Also, in the reflectors 35 and 36, the distance between the centers of the electrode fingers 35a and 36a (pitch of the electrode fingers 35a and 36a) is preferably set to be about 0.5λ.

Figure 7:
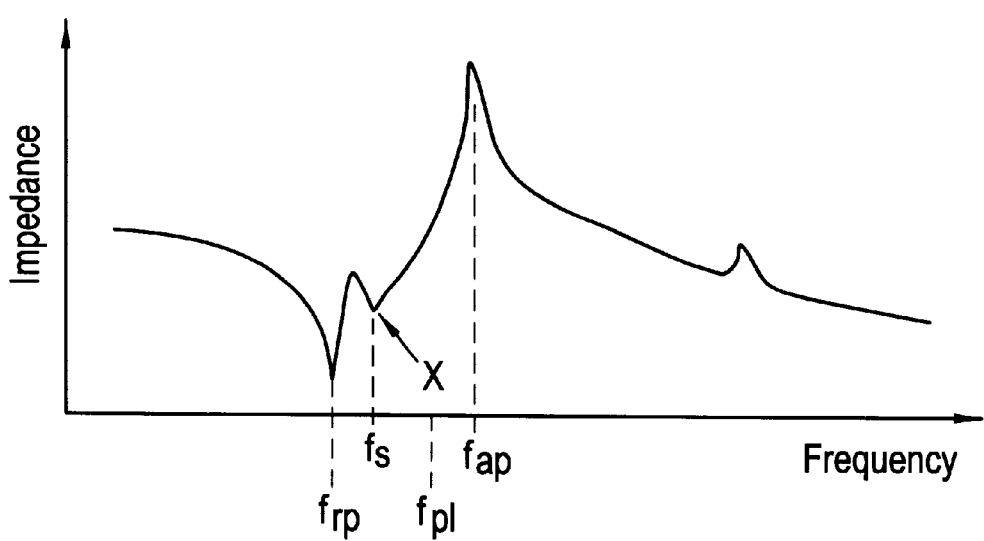
FIG. 7 is a graph illustrating the impedance-frequency characteristic of the SAW resonator used as a parallel resonator in the SAW filter shown in FIG. 4.

The SAW resonator 31, used as a parallel resonator in the SAW filter 21, exhibits a relatively strong spurious component X having a frequency $f_s$ between the resonant frequency $f_{rp}$ and the antiresonant frequency $f_{ap}$, as shown in FIG. 7. The importance of this strong spurious component will be described in more detail below.

Conventionally, the distance r between the reflector 35 or 36 and the IDT 32 has been set to be about 0.5λ because, in conventional devices, prevention of any spurious component X was thought to be required for proper functioning of the filter 21. It was previously considered that the spurious component X would only decrease the performance and characteristics of such a SAW filter. Therefore, in the prior art devices, the distance r was always set to be 0.5λ to prevent the generation of such a spurious component X. This distance r in the prior art devices was not varied to be greater than or less than 0.5λ because it was known that such a change in value of r would produce an undesired spurious component.

In this specification, the distance r between a reflector and an IDT is defined as a center to center distance between the electrode finger of the reflector and the electrode finger of the IDT which are adjacent to each other. In other words, the distance r is a distance from the center of the electrode finger of the reflector which is closest to the IDT to the center of the electrode finger of the IDT which is closest to the reflector. For example, FIG. 5 shows that the distance r is defined by a distance between the center of the electrode finger 35m of the reflector 35 and the center of the electrode finger 34m of the IDT 32.

Figure 8:
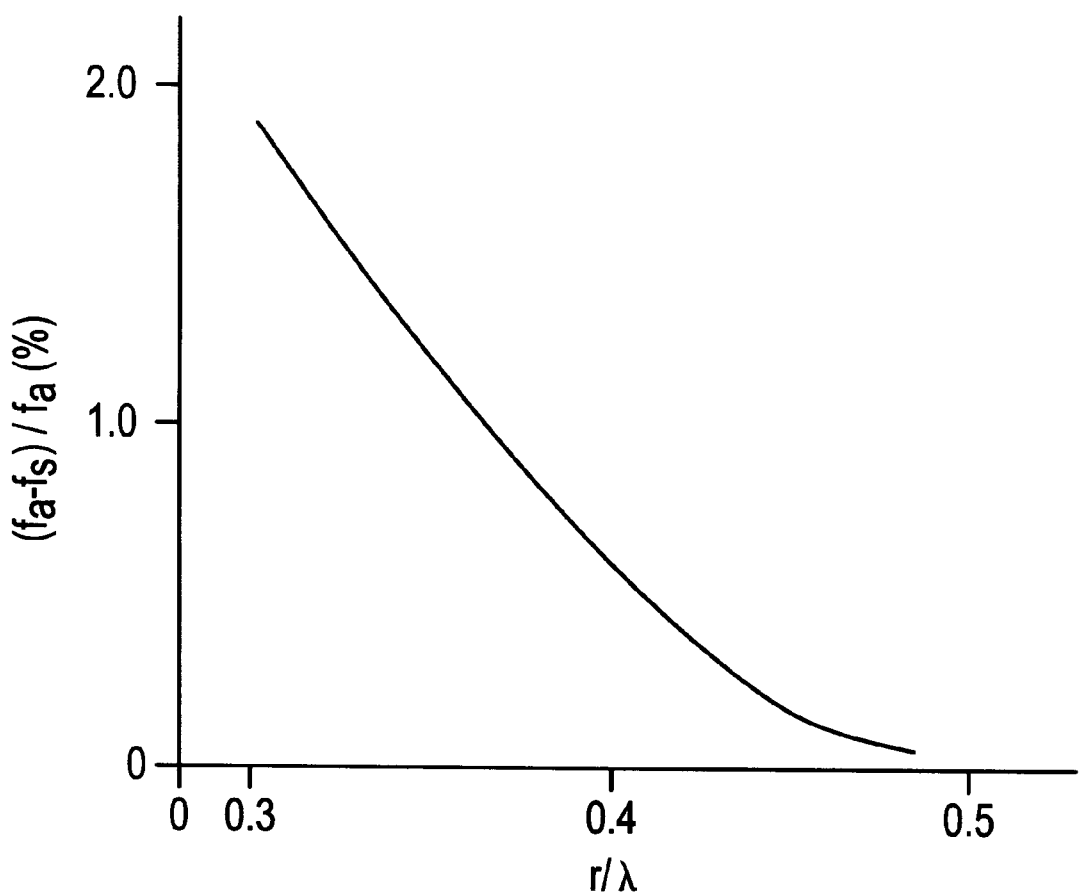
FIG. 8 is a graph illustrating the relationship between a frequency at which a spurious component is generated and the distance between the IDT and the reflector.

The inventors of the preferred embodiments of the present invention discovered that the amounts of attenuation in the stopband are increased by advantageously utilizing the spurious component X instead of trying to eliminate or suppress the spurious component X as in the prior art devices. As a result of the inventors' discovery and analysis pursuant thereto, it has been confirmed as shown in FIG. 8 that the frequency $f_s$ of the spurious component can be controlled and that the frequency $f_s$ decreases as the distance r between the IDT 32 and the reflector 35 becomes smaller than 0.5λ. Thus, the spurious component X can be generated at any desired frequency by adjusting the distance r and the spurious component X can be used effectively to improve the filter characteristics of the SAW filter.

In order to use the spurious component for significantly increasing an amount of attenuation, it is necessary to produce the spurious component X at a specific, desired frequency. Specifically, if the frequency $f_s$ of the spurious component is too high, ripples are produced within the passband, which would result in deterioration of the insertion loss. Conversely, if the frequency $f_s$ is too low, the spurious component X is buried in the resonant characteristics of the SAW resonator 31 and thus, the amounts of attenuation are not improved.

The SAW filter 21 according to the present preferred embodiment is intended to achieve an increase in steepness of the frequency response between the low end of the passband and the end of the stopband. The inventors have discovered that the frequency response having increased steepness between the low end of the passband and the end of the stopband is achieved by setting the frequency $f_s$ of the spurious component higher than the resonant frequency $f_{rp}$ of the parallel resonators. Furthermore, the inventors discovered that the insertion loss can be prevented from being increased by setting the frequency $f_s$ to be lower than the low end $f_{pl}$ of the passband. Consequently, as shown in FIG. 7, the frequency $f_s$ of the spurious component is preferably set between the resonant frequency $f_{rp}$ of the parallel resonators and the lower end $f_{pl}$ of the passband of the SAW filter 21.

In view of the foregoing, in the SAW filter 21 according to the present preferred embodiment, the distance r between each interdigital transducer of the parallel resonators 23, 25, 27 and the adjacent resonator is preferably set as given in Table 1. Specifically, in the parallel resonators 23 and 27, the distance r between the IDT and the reflector is preferably set to about 0.46λ. In the parallel resonator 25, the distance r is preferably set to about 0.43λ. That is, both values are set to be preferably less than about 0.5λ. On the other hand, the distance r is preferably set to about 0.50λ in the series resonators 24 and 26 connected in series.

Figure 9:
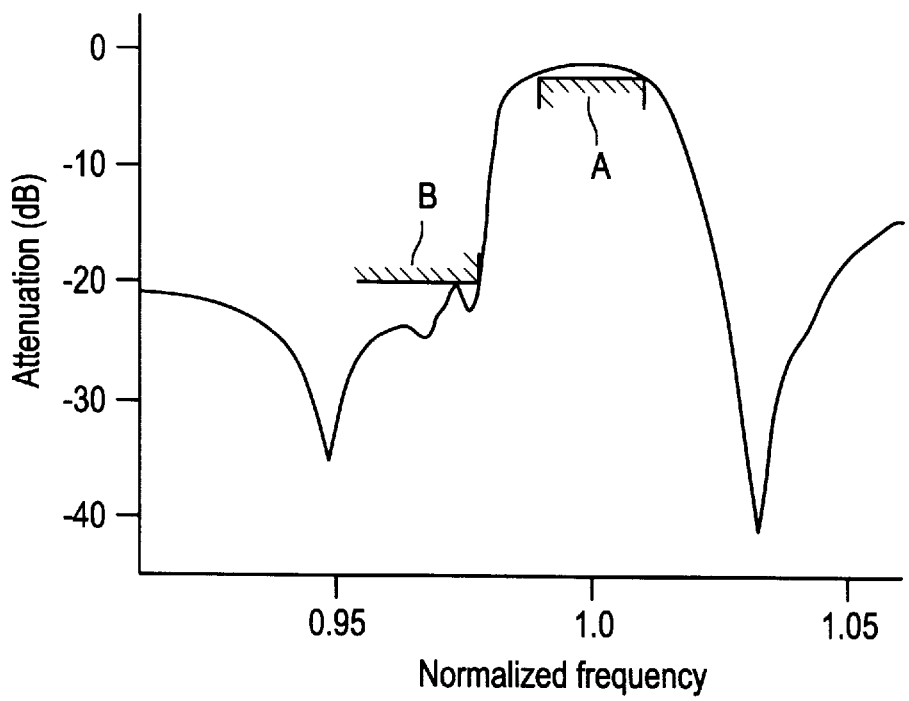
FIG. 9 is a graph illustrating the frequency response of the SAW filter shown in FIG. 4.

The filtering characteristics of the SAW filter 21 constructed as described thus far are shown in FIG. 9. For comparison, a SAW filter was constructed which was similar to the SAW filter 21 except that the distance between the IDT and the reflector was set to 0.50λ for all the SAW resonators 23–27. The filtering characteristics of this SAW filter built for comparison are shown in FIG. 10.

Figure 10:
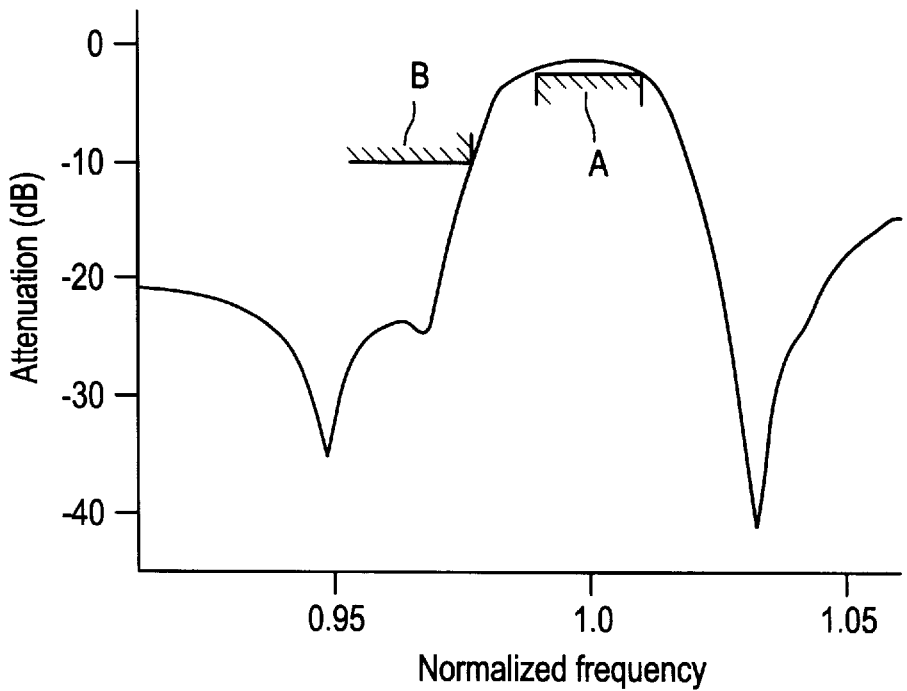
FIG. 10 is a graph illustrating the frequency response of the SAW filter according to a comparative example for comparison to preferred embodiments of the present invention.

Comparison of the frequency characteristics of FIGS. 9 and 10 reveals that frequency response of the SAW filter 21 drops on the lower side of the passband (denoted as A) more abruptly and has a steeper incline than that of the comparative SAW filter. Thus, the stopband attenuation at the frequency region B is improved by about 10 dB, compared to that of the comparative SAW filter.

Figure 11:
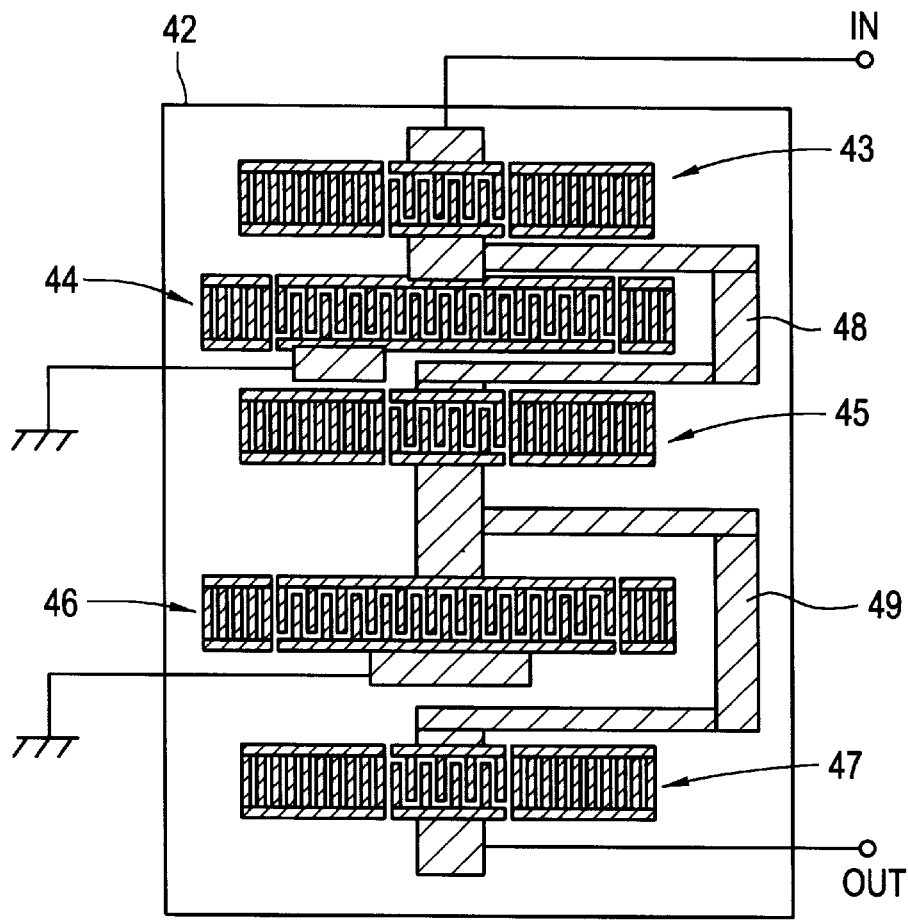
FIG. 11 is a plan view of a SAW filter according to a second preferred embodiment of the invention.
Figure 12:
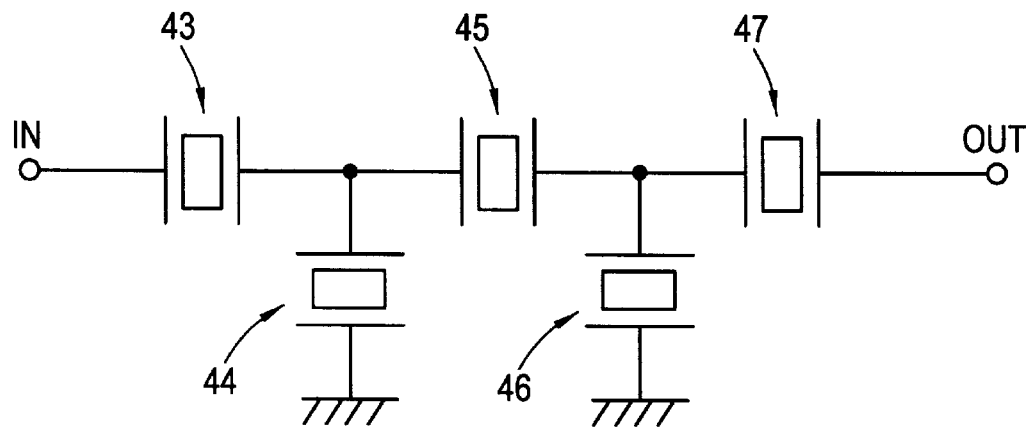
FIG. 12 is a circuit diagram of the SAW filter shown in FIG. 11.

FIGS. 11 and 12 are a schematic plan view and a circuit diagram of a SAW (surface acoustic wave) filter according to a second preferred embodiment of the invention, respectively. The SAW filter, generally indicated by reference numeral 41, includes a substantially rectangular piezoelectric substrate 42. This substrate 42 is preferably made of a 36°-rotated, Y-cut piezoelectric plate of LiTaO$_3$.

Series resonators 43, 45 and 47 and parallel resonators 44 and 46 each including a one-port SAW resonator and connecting electrodes 48 and 49 are arranged on the substrate 42. Each of the one-port SAW resonators 43–47 comprises an IDT and a pair of reflectors which interpose the IDT, as explained in detail in the first preferred embodiment with reference to FIGS. 4 and 5.

In the present preferred embodiment, the series resonators 43, 45, and 47 are connected in series between the input terminal IN and the output terminal OUT. The parallel resonators 44 and 46 are connected in parallel between the series arm of the resonators 43, 45, 47 and the reference potential. Thus, as shown in FIG. 12, a 2.5 stage-ladder circuit is constructed and includes three series resonators and two parallel resonators. The antiresonant frequency $f_{ap}$ of the parallel resonators 44 and 46 connected in parallel is preferably set to be equal to the resonant frequency $f_{rs}$ of the series resonators 43, 45, 47 connected in series.

In the SAW filter 41 according to the present preferred embodiment, the SAW resonators 43 to 47 are constructed preferably using parameters as given in Table 2 below.

TABLE 2

| Resonator | Number of electrode fingers in Reflector | Number of IDT pairs | Overlap width | IDT wavelength | IDT-reflector distance |
|---|---|---|---|---|---|
| SAW resonator 43, 47 | 100 | 120 | 100 | 4.422 | 0.50λ |
| SAW resonator 44, 46 | 80 | 80 | 120 | 4.591 | 0.60λ |
| SAW resonator 45 | 100 | 100 | 70 | 4.403 | 0.50λ |

The distance r from the center of the electrode finger of the reflector which is closest to the IDT, to the center of the electrode finger of the IDT which is closest to the reflector is preferably set to about 0.5λ for the series resonators 43, 45, 47.

For the parallel resonators 44 and 46, the distance r is preferably set to about 0.6λ, which is greater than 0.5λ. Therefore, the amounts of attenuation between the higher end of the pass band and the end of stopband can be improved. This is described in further detail by referring to FIGS. 13 and 14.

Figure 13:
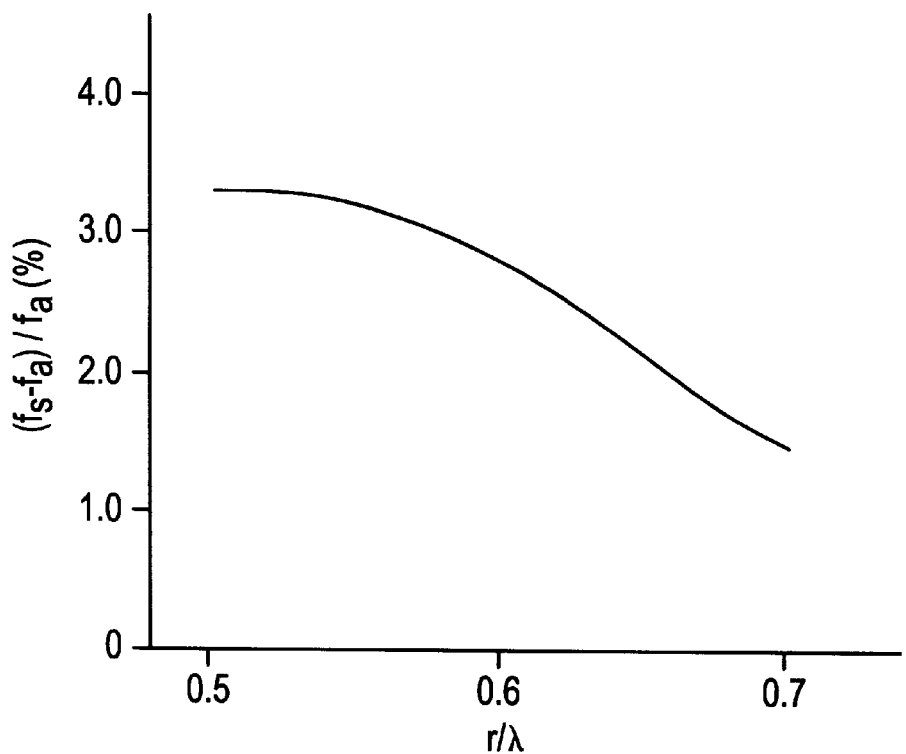
FIG. 13 is a graph illustrating the relationship between a frequency at which a spurious component is generated and the electrode finger distance between the IDT and the reflector.
Figure 14:
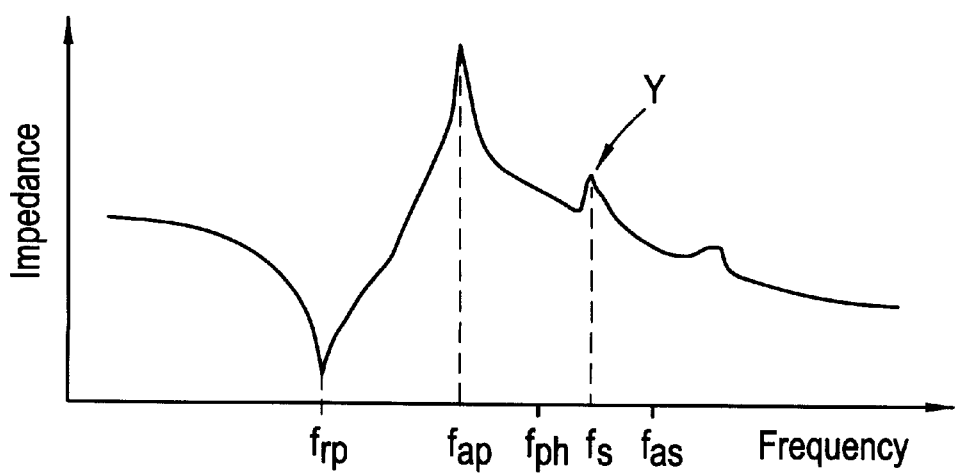
FIG. 14 is a graph illustrating the impedance-frequency characteristics of the parallel resonator in the SAW filter shown in FIG. 11.

FIG. 13 shows the relationship between a frequency at which a spurious component is generated and the distance r between the IDT and the reflector. As shown in FIG. 13, when the distance r is greater than about 0.5λ, a spurious component is produced at a frequency $f_s$ higher than the antiresonant frequency $f_a$ of the SAW resonator. It is also shown that the frequency $f_s$ of the spurious component varies if the distance r is changed. Accordingly, it is understood that the spurious component can be also utilized to make a more abrupt and steeper frequency response between the high end of the passband and the end of stopband.

Figure 1:
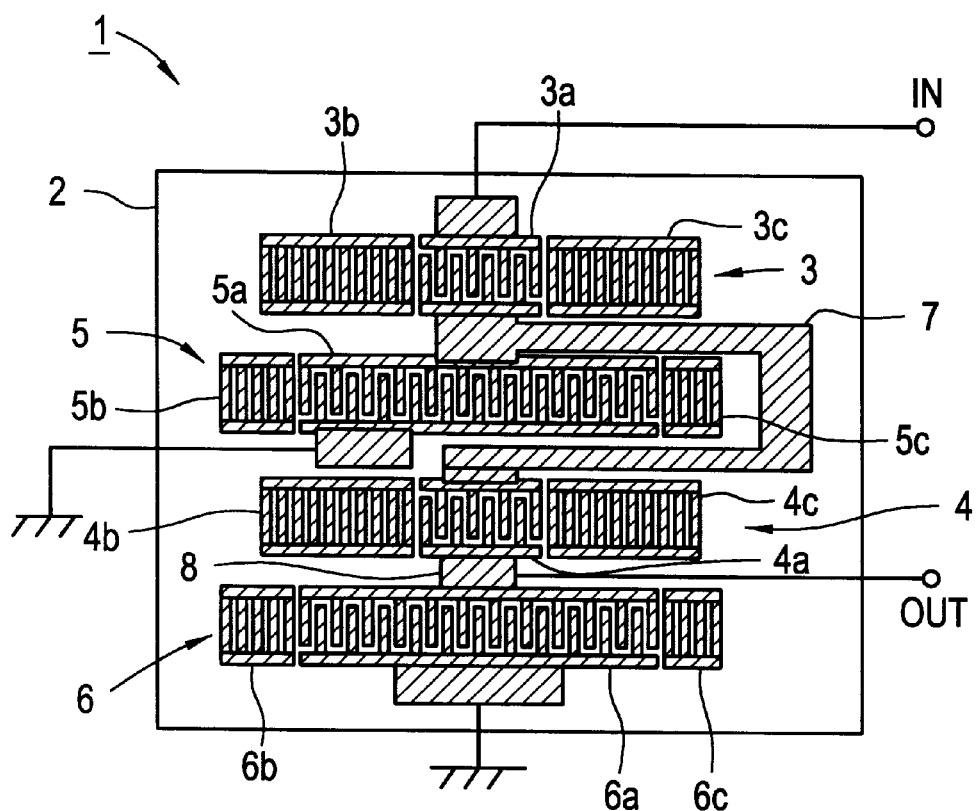
FIG. 1 is a plan view showing the conventional ladder type SAW filter.
Figure 2:
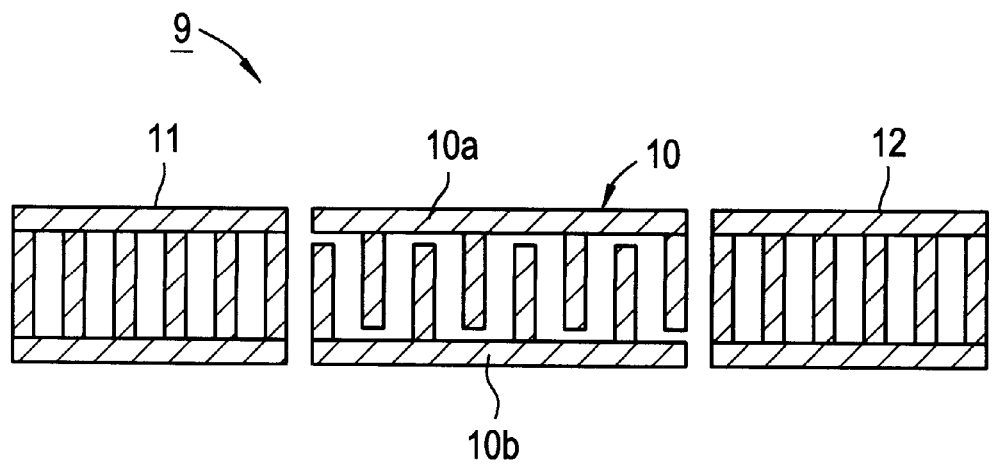
FIG. 2 is a plan view schematically showing an electrode structure of a one-port SAW resonator used in the SAW filter shown in FIG. 1.
Figure 3A:
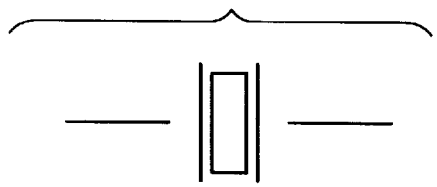
FIG. 3A is a diagram illustrating a circuit symbol used to denote a SAW resonator.
Figure 3B:
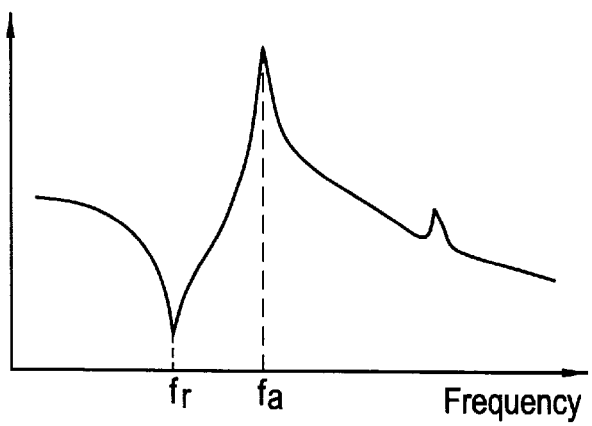
FIG. 3B is a graph illustrating the impedance-frequency characteristic of the prior art SAW resonator shown in FIG. 2.
Figure 3D:
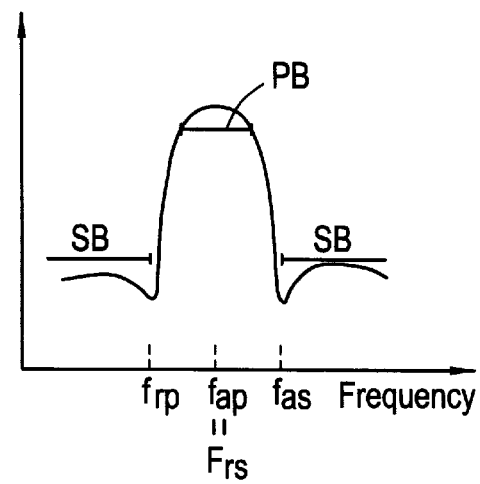
FIG. 3D shows an impedance-frequency characteristic of the SAW filter shown in FIG. 1.
Figure 3C:
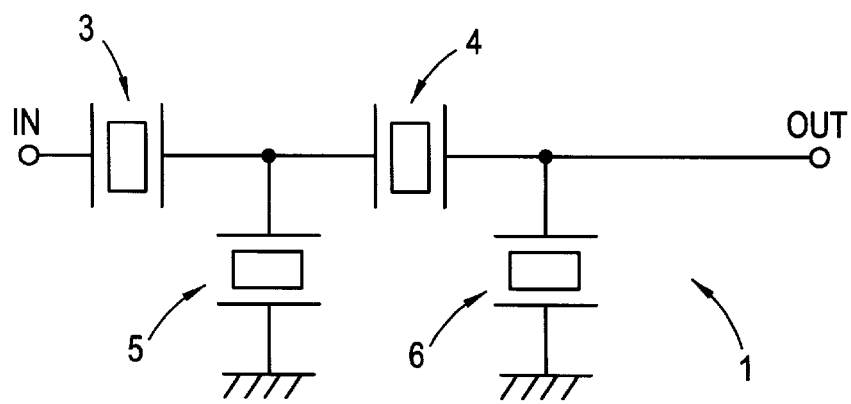
FIG. 3C shows a circuit diagram of the SAW filter shown in FIG. 1.
Figure 15:
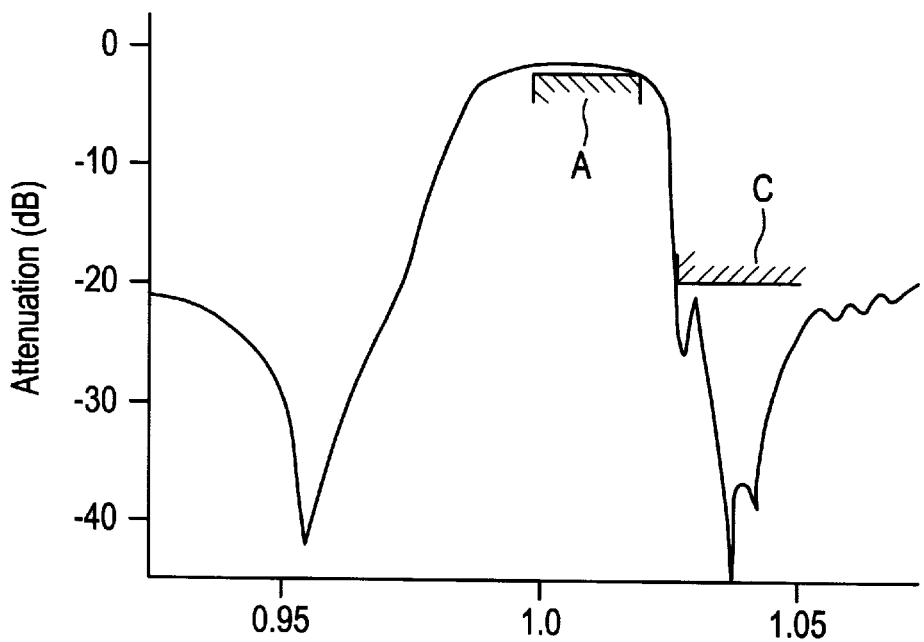
FIG. 15 is a graph illustrating the frequency response of the SAW filter shown in FIG. 11.

FIG. 15 shows impedance-frequency characteristics of the parallel resonators 44 and 46. Since the frequency response between the higher end of the passband and the end of stopband relates to a antiresonant frequency $f_{as}$ of the series resonator (See, FIG. 3D), the inventors determined that the frequency $f_s$ of the spurious component Y should be set to be lower than the antiresonant frequency $f_{as}$ of the series resonators. Furthermore, the inventors determined that in order to prevent the insertion loss from increasing, the frequency $f_s$ should be higher than the high end $f_{ph}$ of the passband. Consequently, the frequency $f_s$ of the spurious component is set between the antiresonant frequency $f_{as}$ of the series resonators and the higher end $f_{ph}$ of the passband of the SAW filter 41.

In view of the foregoing, in the SAW filter 41 according to the present preferred embodiment, the distance r between each IDT of the parallel resonators 44, 46 and the adjacent resonator is preferably set as given in Table 2. More specifically, in each of the parallel resonators 44 and 46, the distance between the IDT and the adjacent reflector is preferably set to about 0.6λ.

The filtering characteristics of the SAW filter 41 according to the second preferred embodiment of the invention are shown in FIG. 15. For comparison, a SAW filter was constructed which was similar in structure with the surface-wave filter 41 described above except that the distance between the interdigital transducer and the adjacent reflector is set to 0.5λ in each of the resonators 44 and 46 connected in parallel. The filtering characteristics of this SAW filter used for comparison are shown in FIG. 16.

Figure 16:
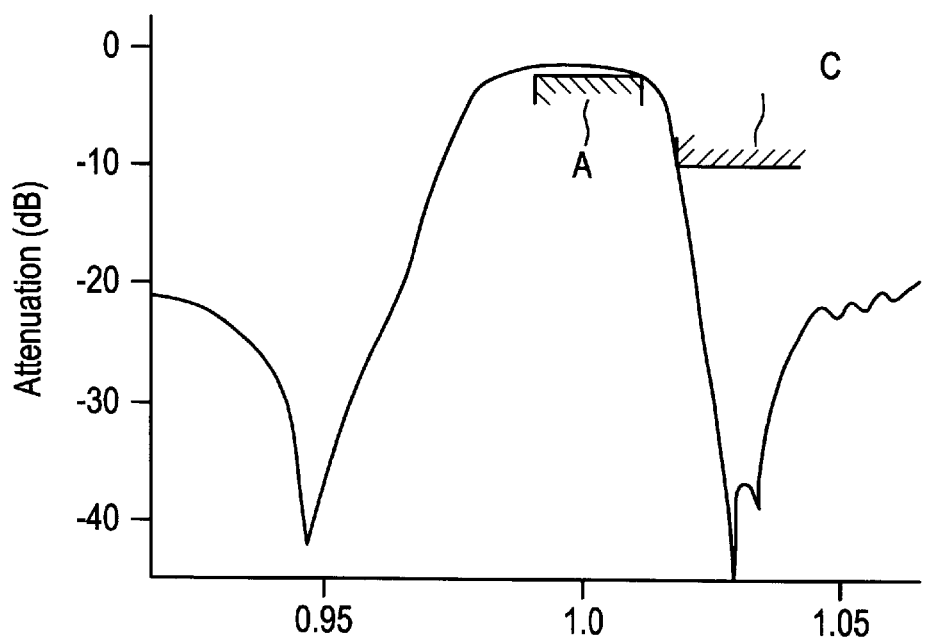
FIG. 16 is a graph illustrating the frequency response of the SAW filter according to a comparative example for comparison to preferred embodiments of the present invention.

Comparison of the frequency characteristics of FIGS. 15 and 16 reveals that frequency response of the SAW filter 41 drops on the higher side of the passband (denoted as A) more abruptly and has a steeper incline than that of the comparative SAW filter. Thus, the stopband attenuation at the frequency region C is improved by about 10 dB, compared to that of the comparative SAW filter.

A SAW filter according to the third preferred embodiment of the invention has the same structure as the SAW filter according to the first preferred embodiment except that three parallel resonators have a different electrode structure from that of the SAW resonators shown in FIG. 6 instead of making the distance between the IDT and the reflector smaller than about 0.5λ.

Figure 17:
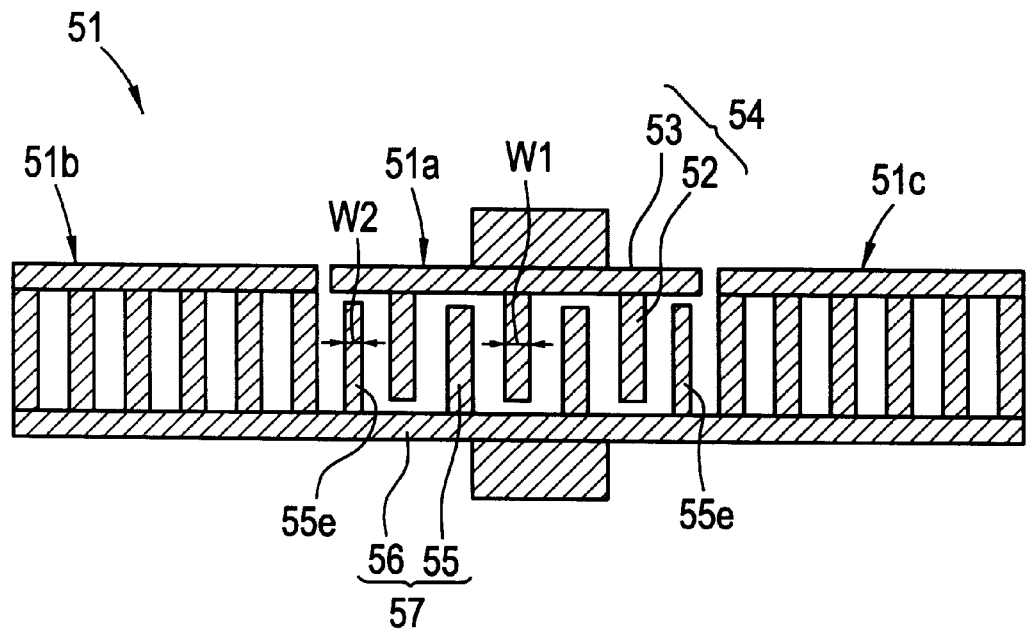
FIG. 17 is a plan view schematically showing an electrode structure of a parallel resonator used in a SAW filter according to a third preferred embodiment.

In the SAW filter according to the third preferred embodiment, the parallel resonators have an electrode structure as shown in FIG. 17. The SAW resonator, generally denoted as numeral 51, comprises an IDT 51a and reflectors 51b and 51c. The IDT 51a is sandwiched between the reflectors 51b and 51c and has a pair of interdigitated electrodes 54 and 57. The interdigitated electrode 54 includes a plurality of electrode fingers 52 and a bus bar 53 connected to the electrode fingers 52, and the interdigitated electrode 57 includes a plurality of electrode fingers 55 and a bus bar 56 connected to the electrode fingers 55, whereby the interdigitated electrodes 54 and 57 are interdigitated with each other. Although the bus bar 56 is connected to the reflectors 51b and 51c, the bus bar 56 may be isolated from the reflectors 51b and 51c.

In the SAW resonator 51, the outermost electrode fingers 55e which are adjacent to the reflectors 51c and 51b, respectively have a width w2 smaller than a width w1 of the other electrode fingers 52 and 55 while the distance between the IDT 51a and the reflector 51b or 51c is preferably set to be about 0.5λ. This configuration provides a steep profile of the frequency response between the lower end of the passband and the end of the stopband. This will be explained in greater detail below.

The spurious component generated in the frequency response of the SAW resonator is generally caused by the discontinuity between the IDT and the reflector. Normally, an IDT and a reflector have a similar structure in which a plurality of electrode fingers are provided to reflect surface acoustic waves. Thus, in the case where an electrode finger which has a different width is provided in an IDT, the reflection of the surface acoustic wave by the electrode finger disturbs the phase of the surface acoustic wave, thereby generating a spurious component.

When the width of the outermost electrode fingers 55e in the SAW resonator 51 is made smaller than the width of the other electrode fingers 52 and 55, the phase difference of the reflected wave becomes small, thereby obtaining the same effects as that in the case where the distance between the IDT and the reflector is decreased. That is, the spurious component can be located between the resonant frequency and the antiresonant frequency of the parallel resonator. In addition, the frequency of the spurious component can be shifted by changing the width of the outermost electrode fingers. Accordingly, the spurious component can be positioned between the resonant frequency of the parallel resonator and the low end of the passband of the SAW filter by making the width of the outermost electrode fingers of the IDT smaller than that of the other electrode fingers, whereby the frequency response between the low end of the passband and the end of the stopband can be made significantly steeper as compared with prior art devices.

A SAW filter according to the fourth preferred embodiment of the invention has the same structure as the SAW filter according to the third preferred embodiment except that width of the outermost electrode fingers is greater than the other electrode fingers.

Figure 18:
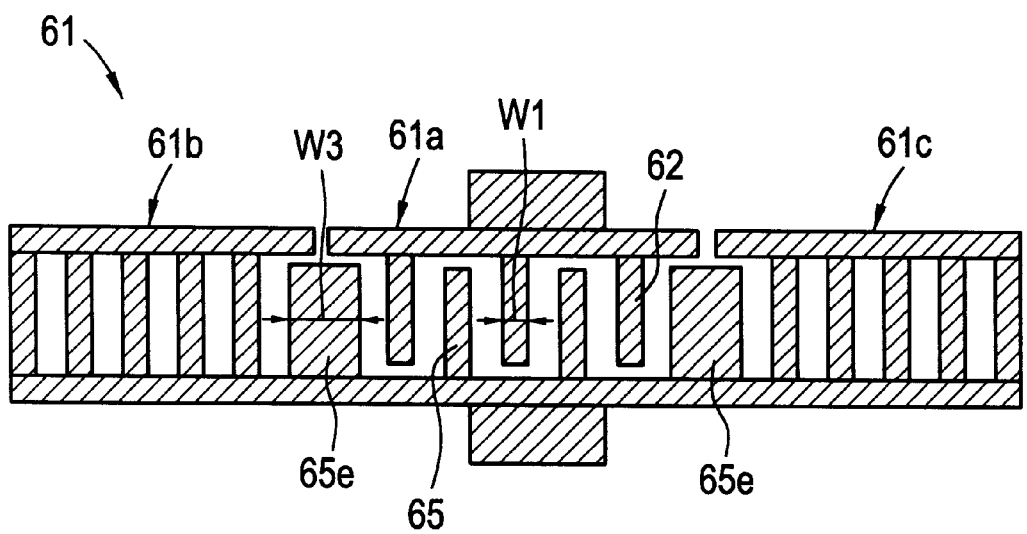
FIG. 18 is a plan view schematically showing an electrode structure of a parallel resonator used in a SAW filter according to a fourth preferred embodiment.

More specifically, in the SAW filter according to the fourth preferred embodiment, the parallel resonators have the electrode structure as shown in FIG. 18. The SAW resonator 61 comprises an IDT 61a and reflectors 61b and 61c. In the SAW resonator 61, the outermost electrode fingers 65e which are adjacent to the reflectors 61c and 61b, respectively have a width w3 which is greater than the width w1 of the other electrode fingers 62 and 65.

As is understood from the explanation in the third preferred embodiment, when width w3 of the outermost electrode fingers 65e is made greater than the width of the other electrode fingers 62 and 65, the phase change of the reflected wave becomes great, thereby obtaining the same effects as that in the case where the distance between the IDT and the reflector is made greater. Thus, the spurious component can be located on the higher side of the antiresonant frequency of the parallel resonator. The frequency of the spurious component can be also shifted by changing the width of the outermost electrode fingers. Accordingly, the spurious component can be located between the antiresonant frequency of the series resonator and the high end of the passband of the SAW filter by making the width of the outermost electrode fingers of the IDT greater than that of the other electrode fingers, whereby the frequency response between the higher end of the passband and the end of the stopband can be made significantly steeper than prior art filters.

Although in the aforementioned third and fourth preferred embodiments, the width of the outermost electrode fingers of the IDT in the parallel resonators is made different from the width of the other electrode fingers, the electrode structure of the reflectors may be changed.

A SAW filter according to the fifth preferred embodiment of the invention has the same structure as the SAW filter according to the first preferred embodiment except that three parallel resonators have a different electrode structure from that of the SAW resonators shown in FIG. 6 instead of making the distance between the IDT and the reflector smaller than about 0.5λ.

Figure 19:
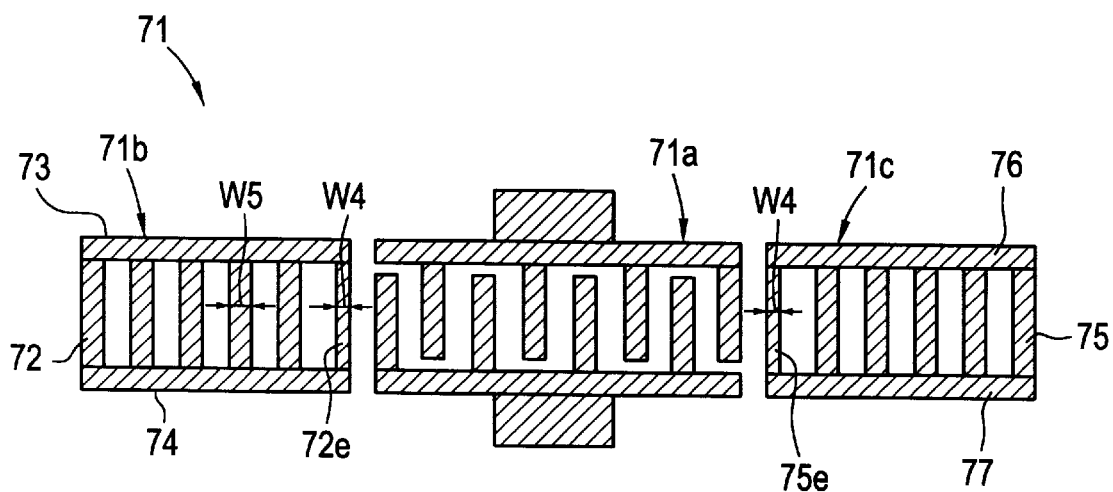
FIG. 19 is a plan view schematically showing an electrode structure of a parallel resonator used in a SAW filter according to a fifth preferred embodiment.

In the SAW filter according to the fifth preferred embodiment, the parallel resonators have the electrode structure as shown in FIG. 19. The SAW resonator 71 comprises an IDT 71a and reflectors 71b and 71c. The IDT 71a is sandwiched between the reflectors 71b and 71c. The reflectors 71b includes a plurality of electrode fingers 72 and bus bars 73 and 74 which are connected at both ends of the electrode fingers 72, respectively. The reflectors 71c also include a plurality of electrode fingers 75 and bus bars 76 and 77 which are connected at both ends of the electrode fingers 75, respectively.

In the reflectors 71b and 71c, the electrode fingers 72e and 75e which are adjacent to the IDT 71a have a width w4 which is smaller than a width w5 of the other electrode fingers 72 and 75. This configuration provides the abrupt and steep profile of the frequency response between the low end of the passband and the end of the stopband since the reflector makes the phase change of the reflected wave small to obtain the same effects as the effects achieved in the case where the distance between the IDT and the reflector is reduced.

Accordingly, the spurious component can be positioned between the resonant frequency of the parallel resonator and the low end of the passband of the SAW filter by making the width of the electrode fingers of the reflector which is adjacent to the IDT smaller than that of the other electrode fingers, whereby the frequency response between the lower end of the passband and the end of the stopband can be made significantly steeper than prior art filters.

A SAW filter according to the sixth preferred embodiment of the present invention has the same structure as the SAW filter according to the fifth preferred embodiment except that a width of the electrode finger of the reflectors which is adjacent to the IDT is greater than the other electrode fingers.

Figure 20:
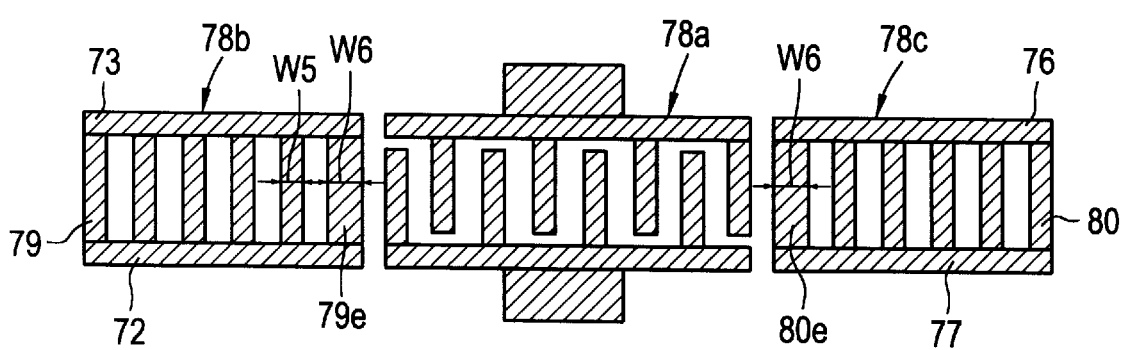
FIG. 20 is a plan view schematically showing an electrode structure of a parallel resonator used in a SAW filter according to a sixth preferred embodiment.

In the SAW filter according to the sixth preferred embodiment, the parallel resonators have the electrode structure as shown in FIG. 20. The SAW resonator 78 comprises an IDT 78a and reflectors 78b and 78c. The IDT 78a is sandwiched between the reflectors 78b and 78c. The reflector 78b includes a plurality of electrode fingers 79 and bus bars 73 and 74 which are connected at both ends of the electrode fingers 79, respectively. The reflector 78c also includes a plurality of electrode fingers 80 and bus bars 76 and 77 which are connected at both ends of the electrode fingers 80, respectively.

In the reflectors 78b and 78c, the electrode fingers 79e and 80e which are adjacent to the IDT 78a have a width w6 which is greater than the width w5 of the other electrode fingers 79 and 80. This configuration provides the abrupt and steep profile of the frequency response between the high end of the passband and the end of the stopband, since the reflector increases the magnitude of the phase change of the reflected wave to obtain the same effects as the effects achieved in the case where the distance between the IDT and the reflector is increased.

Accordingly, the spurious component can be positioned between the antiresonant frequency of the series resonator and the high end of the passband of the SAW filter by making the width of the one of the electrode fingers of the reflector which is adjacent to the IDT greater than that of the other electrode fingers, whereby the frequency response between the high end of the passband and the end of the stopband can be made significantly steeper than prior art filters.

Figure 21A:
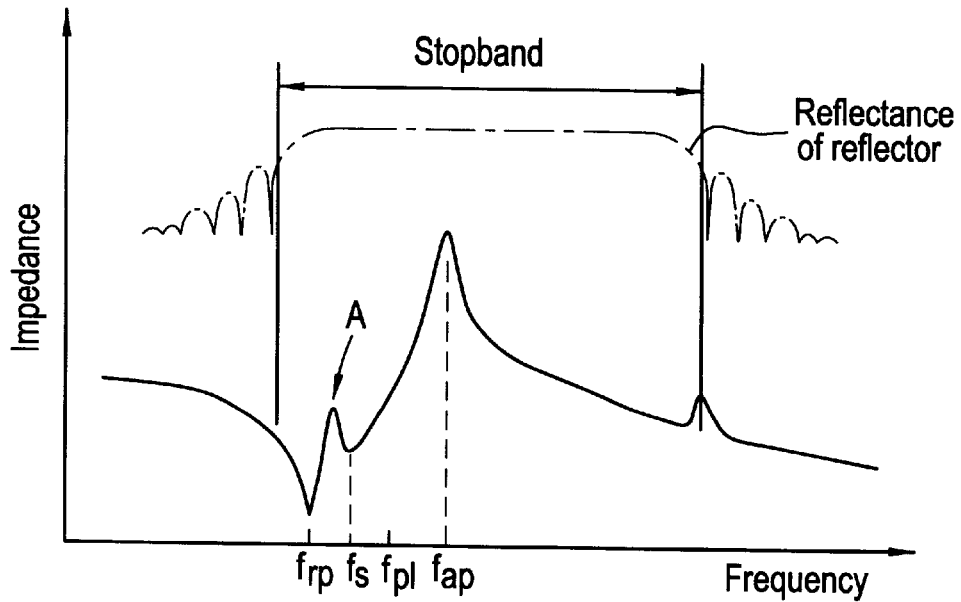
FIG. 21A is a graph showing impedance-frequency characteristics of parallel resonators according to the first to sixth preferred embodiments.
Figure 21B:
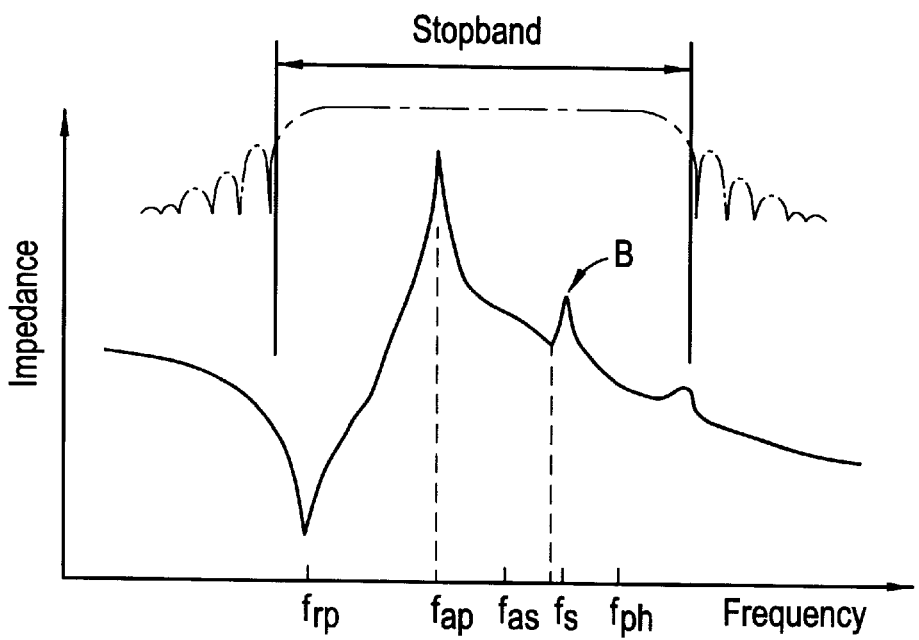
FIG. 21B is a graph showing impedance-frequency characteristics of parallel resonators according to the first to sixth preferred embodiments.

In the aforementioned first to sixth preferred embodiments, the spurious component of the parallel resonators which form a SAW filter with series resonators having a ladder circuit, is preferably located between the resonance frequency $f_{rp}$ of the parallel resonator and the low end $f_{pl}$ of the passband of the SAW filter as shown in FIG. 21A, or between the antiresonant frequency of the series resonator and the high end $f_{ph}$ of the passband of the SAW filter as shown in FIG. 21B. Although these configurations can successfully improve the steepness of the frequency response at the vicinity of the lower or higher end of the passband, these configurations may cause parallel resonance at the vicinity of spurious component due to the complex impedance of the spurious component and main resonance in the parallel resonator which produces a high impedance point A or B as shown in FIGS. 21A and 21B. As a result, the high impedance point A or B may adversely cause a ripple in the spike shape within the stopband of the frequency response. This might degrade the attenuation in of the stopband.

The present preferred embodiment described hereinafter provides a structure to suppress the ripple which appears within the stopband and can be combined with a SAW filter according to any one of the first to six preferred embodiments.

Figure 22A:
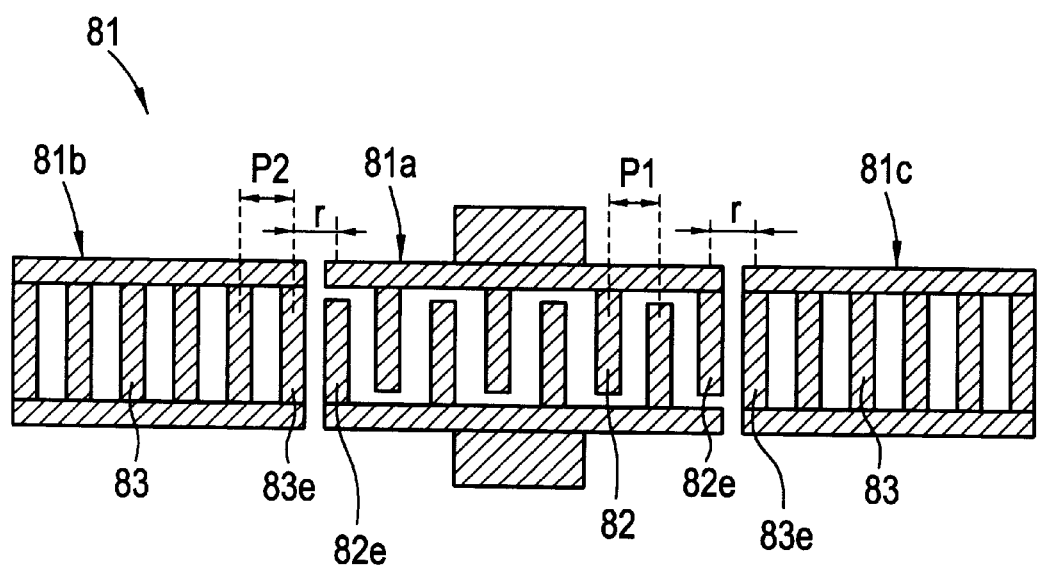
FIG. 22A is a plan view schematically showing an electrode structure of a parallel resonator used in a SAW filter according to a seventh preferred embodiment.

FIG. 22A shows a plan view of a parallel resonator in a SAW filter according to the seventh preferred embodiment. The parallel resonator 81 has a structure which includes the structure according to the first preferred embodiment and a structure to suppress the ripple which may appear within the stopband. As shown in FIG. 22A, the parallel resonator 81 includes an IDT 81a and a pair of reflectors 81b and 81c. The IDT 81a includes a pair of interdigitated electrodes having a plurality of electrode fingers 82 and being interdigitated with each other. The IDT 81a is sandwiched between the reflectors 81b and 81c. The reflectors 81b and 81c include a plurality of electrodes fingers 83, respectively.

In the parallel resonator 81, the distance r from the center of the electrode finger 83e of the reflector 81b or 81c which is closest to the IDT 81a, to the center of the electrode finger 82e of the IDT which is closest to the reflector 81b or 81c is preferably set to be less than about 0.5 λ, where λ is a wavelength of the surface acoustic wave to be excited in the parallel resonator 81, as explained in detail in the first preferred embodiment.

Further, the pitch p2 between the electrode fingers 83 in the reflectors 81b and 81c is preferably less than the pitch p1 between the electrode fingers 82 in the IDT 81a. In this specific preferred embodiment, the ratio p1/p2 is preferably set to be equal to about 1.02. This configuration achieves the positioning of the spurious component at a frequency lower than the low end of the stopband of the reflector of the parallel resonator 81, thereby improving the attenuation of the stopband of the SAW filter which includes the parallel resonator 81 in a ladder circuit thereof. This will be explained in more detail hereinafter.

A cavity-type one port SAW resonator can generally obtain high Q value by confining the energy of the surface acoustic wave in the resonator via the reflectors. The reflectivity of the resonators is very large within the stopband due to substantial total reflection, and the stopband of the reflector is therefore defined by a frequency range in which the surface acoustic waves are totally reflected. However, the reflectivity is very low outside of the stopband, which results in a low confinement efficiency. Accordingly, it is possible to suppress the impedance peak of the spurious component without increasing the insertion loss by adjusting the aforementioned stopband so that the impedance peak caused by the spurious component is located outside of the stopband and so that the antiresonant frequency is within the stopband.

The center frequency of the stopband is determined by the pitch of the electrode fingers in the reflectors. The band width of the stopband is determined by the width of the electrode fingers and the reflectivity in the reflector. The resonant frequency and the anti-resonant frequency are determined by the pitch of the electrode fingers in the IDT. Thus, the resonant frequency, the antiresonant frequency and the impedance peak caused by the spurious component of the parallel resonator can be set at any desired position with respect to the stopband of the reflector of the parallel resonator by adjusting the ratio between the pitch of the electrode fingers in the reflectors and the pitch of the electrode fingers in the IDT.

Figure 23A:
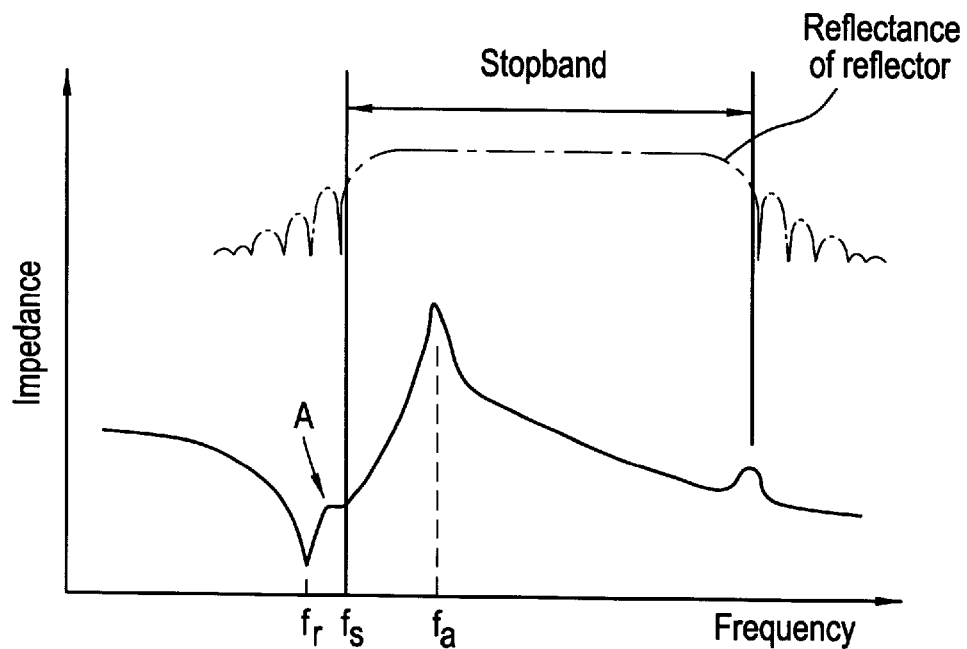
FIG. 23A is a graph showing impedance-frequency characteristics of the parallel resonators shown in FIG. 22A.

FIG. 23A is a graph showing an impedance-frequency characteristics of the parallel resonator 81 shown in FIG. 22A. As shown in FIG. 23A, the stopband of the reflector is shifted such that the impedance peak A caused by the spurious component is located outside of the stopband, thereby suppressing the impedance peak A.

Figure 24:
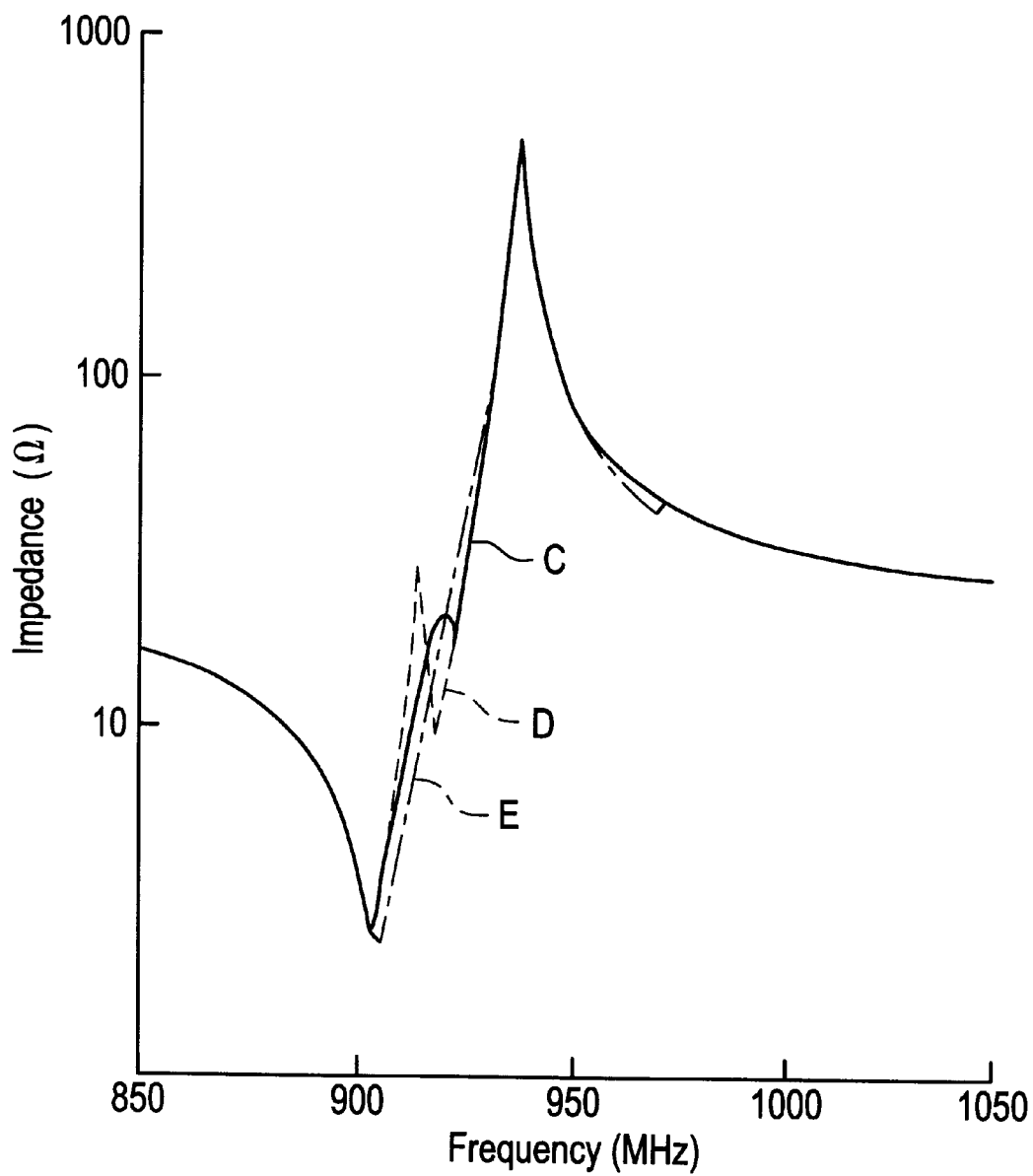
FIG. 24 is an enlarged graph showing an impedance-frequency characteristic of the parallel resonator shown in FIG. 22A.

FIG. 24 is a graph showing in more detail an impedance-frequency characteristics in the vicinity of the spurious components generated in the parallel resonator 81. In FIG. 24, the curve C shows an impedance-frequency characteristics in the case where the distance between the IDT and reflector is preferably set at about 0.33λ and the pitch ratio is about 1.02 according to the present preferred embodiment. The curve D is a comparative example in the case where the distance between the IDT and reflector is set at 0.4λ and the pitch ratio is 1.00. The curve E is comparative example in the case where the distance between the IDT and reflector is set at 0.5λ and the pitch ratio is 1.00 (i.e., no spurious component is generated).

As can be seen in FIG. 24, in the curve C, the impedance peak caused by the spurious component is successfully suppressed without degrading the desired steepness of the impedance-frequency curve between the resonant frequency and the antiresonant frequency.

Figure 25:
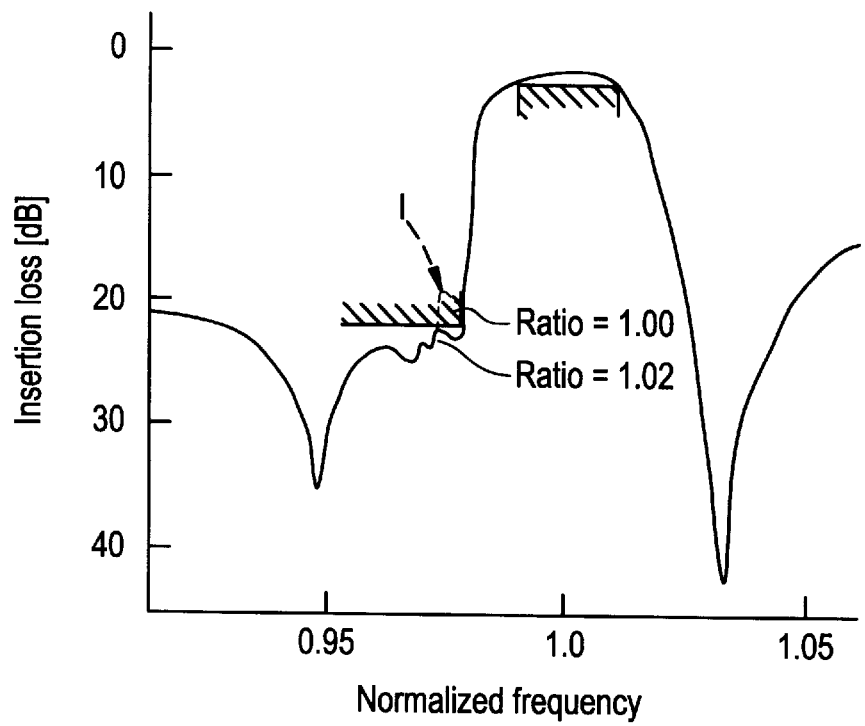
FIG. 25 is a graph showing a frequency response of the SAW filter with the parallel resonator shown in FIG. 22A.

FIG. 25 is a graph showing a frequency response according to the SAW filter which comprises a ladder circuit including the parallel resonator 81 according to the present preferred embodiment. FIG. 25 also shows a frequency response obtained by the SAW filter according to the first preferred embodiment. As can be understood from the FIG. 25, the ripple I which appears within the stopband of the frequency response according to SAW filter of the first preferred embodiment is suppressed in the SAW filter of the present preferred embodiment. As a result, the attenuation at the stopband is improved by about 3 dB, compared to that of the SAW filter according to the first preferred embodiment.

As is explained above, the features of the resonators according to the present preferred embodiment may be incorporated with the structure according to the other preferred embodiments.

Figure 22B:
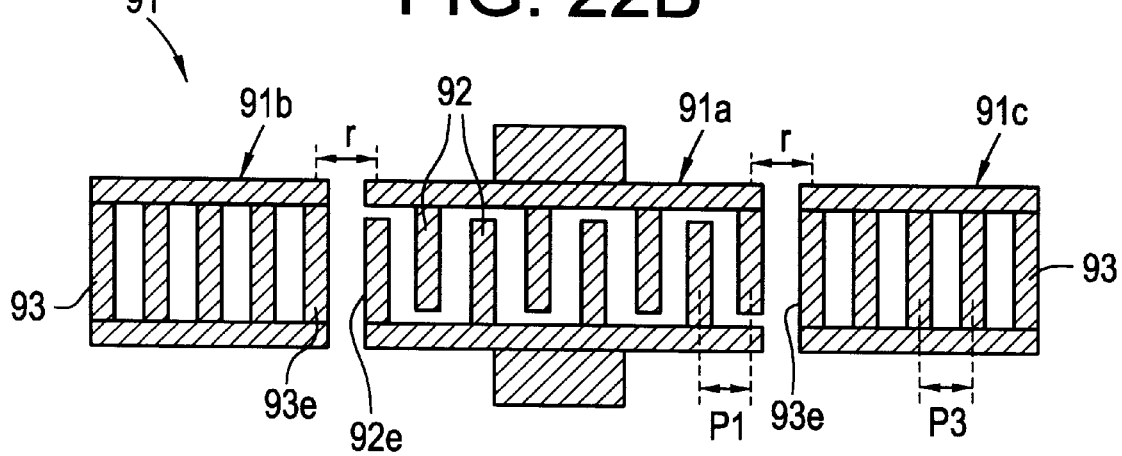
FIG. 22B is a plan view schematically showing an electrode structure of a parallel resonator used in a SAW filter according to a seventh preferred embodiment.

FIG. 22B shows a plan view of a parallel resonator 91 in which the structure according to the second preferred embodiment is incorporated with the structure to suppress the ripple which appears within the stopband. As shown in FIG. 22B, the parallel resonator 91 includes an IDT 91a and a pair of reflectors 91b and 91c. The IDT 91a includes a pair of interdigitated electrodes having a plurality of electrode fingers 92 which are interdigitated with each other. The IDT 91a is sandwiched between the reflectors 91b and 91c. The reflectors 91b and 91c include a plurality of electrodes fingers 93, respectively.

In the parallel resonator 91, the distance r from the center of the electrode finger 93e of the reflector 91b or 91c which is closest to the IDT 91a, to the center of the electrode finger 92e of the IDT which is closest to the reflector 91b or 91c is preferably greater than about 0.5 λ, where λ is a wavelength of the surface acoustic wave to be excited in the parallel resonator 91, as explained in detail in the second preferred embodiment.

Further, a pitch p3 between the electrode fingers 93 in the reflectors 91b and 91c is larger than a pitch p1 between the electrode fingers 92 in the IDT 91a. In this specific preferred embodiment, the ratio p1/p3 is preferably about 0.98. This configuration achieves positioning of the spurious component at a frequency higher than the high end of the stopband of the reflector of the parallel resonator 91, thereby improving the attenuation of the stopband of the SAW filter which includes the parallel resonator 91 in a ladder circuit thereof.

Figure 23B:
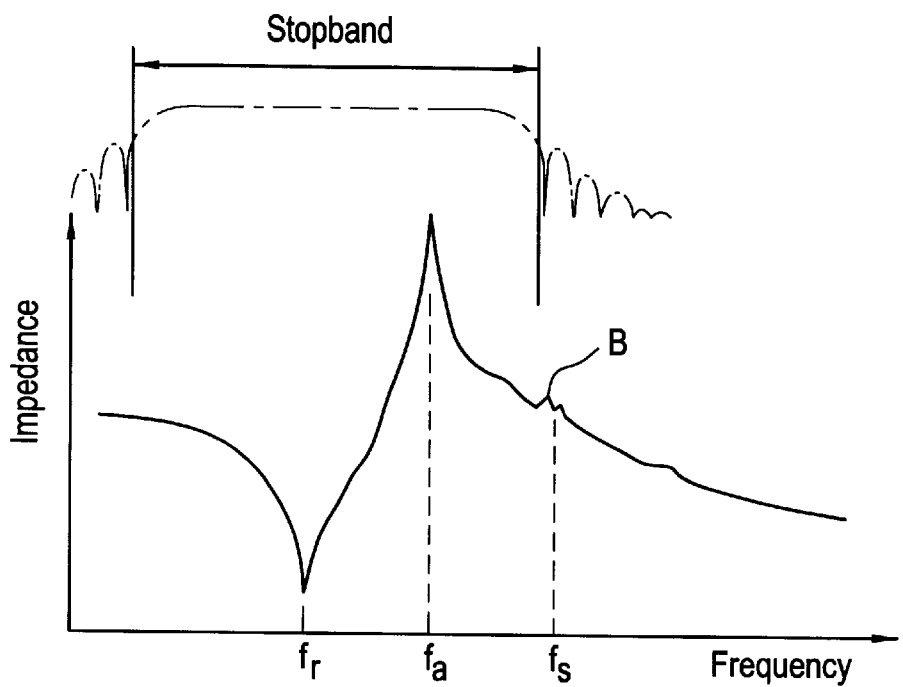
FIG. 23B is a graph showing impedance-frequency characteristics of the parallel resonators shown in FIG. 22B.

FIG. 23B is a graph showing an impedance-frequency characteristics of the parallel resonator 91 shown in FIG. 22B. As shown in FIG. 23B, the stopband is shifted such that the impedance peak B caused by the spurious component is out of the stopband, thereby suppressing the impedance peak B.

Figure 26:
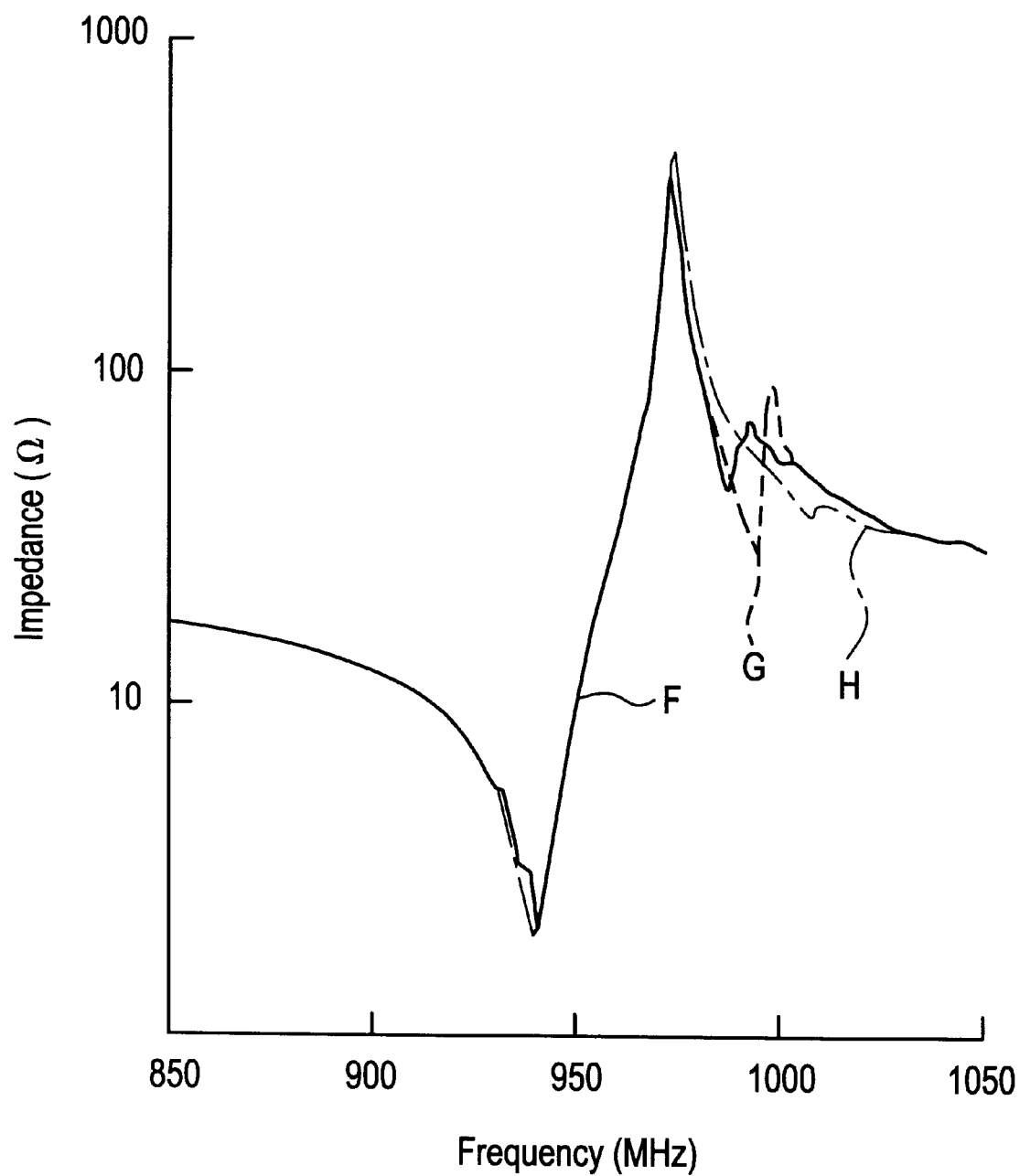
FIG. 26 is an enlarged graph showing an impedance-frequency characteristic of the parallel resonator shown in FIG. 22B.

FIG. 26 is a graph showing in more detail an impedance-frequency characteristic in the vicinity of the spurious components generated in the parallel resonator 91. In FIG. 26, the curve F shows an impedance-frequency characteristics in the case where the distance between the IDT and reflector is preferably set at about 60λ and the pitch ratio p1/p3 is preferably set to be about 0.98. The curve G is a comparative example in the case where the distance between the IDT and reflector is set at 0.65λ and the pitch ratio is 1.00. The curve H is comparative example in the case where the distance between the IDT and reflector is set at 0.5λ and the pitch ratio is 1.00 (i.e., no spurious component is generated).

As can be seen in FIG. 26, in the curve F, the impedance peak caused by the spurious component is successfully suppressed without degrading the desired steepness of the impedance-frequency curve between the resonant frequency and the antiresonant frequency.

Figure 27:
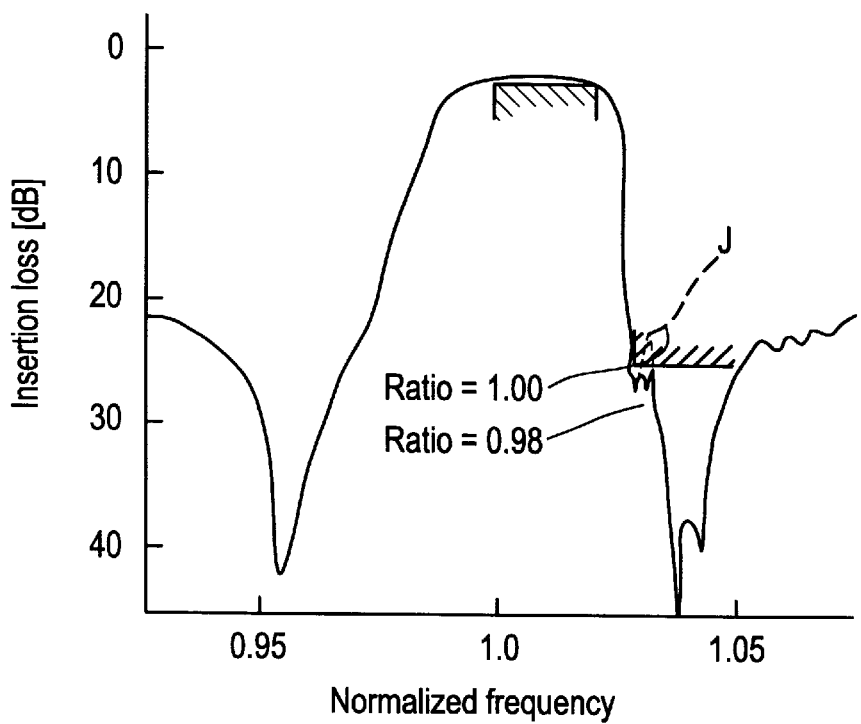
FIG. 27 is a graph showing a frequency response of the SAW filter with the parallel resonator shown in FIG. 22B.

FIG. 27 is a graph showing a frequency response according to the SAW filter which comprises a ladder circuit including the parallel resonator 91 according to the preferred embodiments of the present invention. FIG. 27 also shows frequency response obtained by the SAW filter according to the second preferred embodiment. As can be understood from the FIG. 27, the ripple J which appears within the stopband of the frequency response according to the SAW filter of the second preferred embodiment is suppressed in the SAW filter of the present preferred embodiment. As a result, the attenuation at the stopband is improved by about 3 dB, compared to that of the SAW filter according to the second preferred embodiment.

As explained above, the present preferred embodiment may be incorporated with a SAW filter according to the other preferred embodiments described herein. More specifically, the pitch of the electrode fingers in the reflectors may be less than that of the IDT in the parallel resonator used in the third or fifth preferred embodiment, and the pitch of the electrode fingers in the reflectors may be made greater than that of the IDT in the parallel resonator used in the fourth or sixth preferred embodiment.

Figure 28:
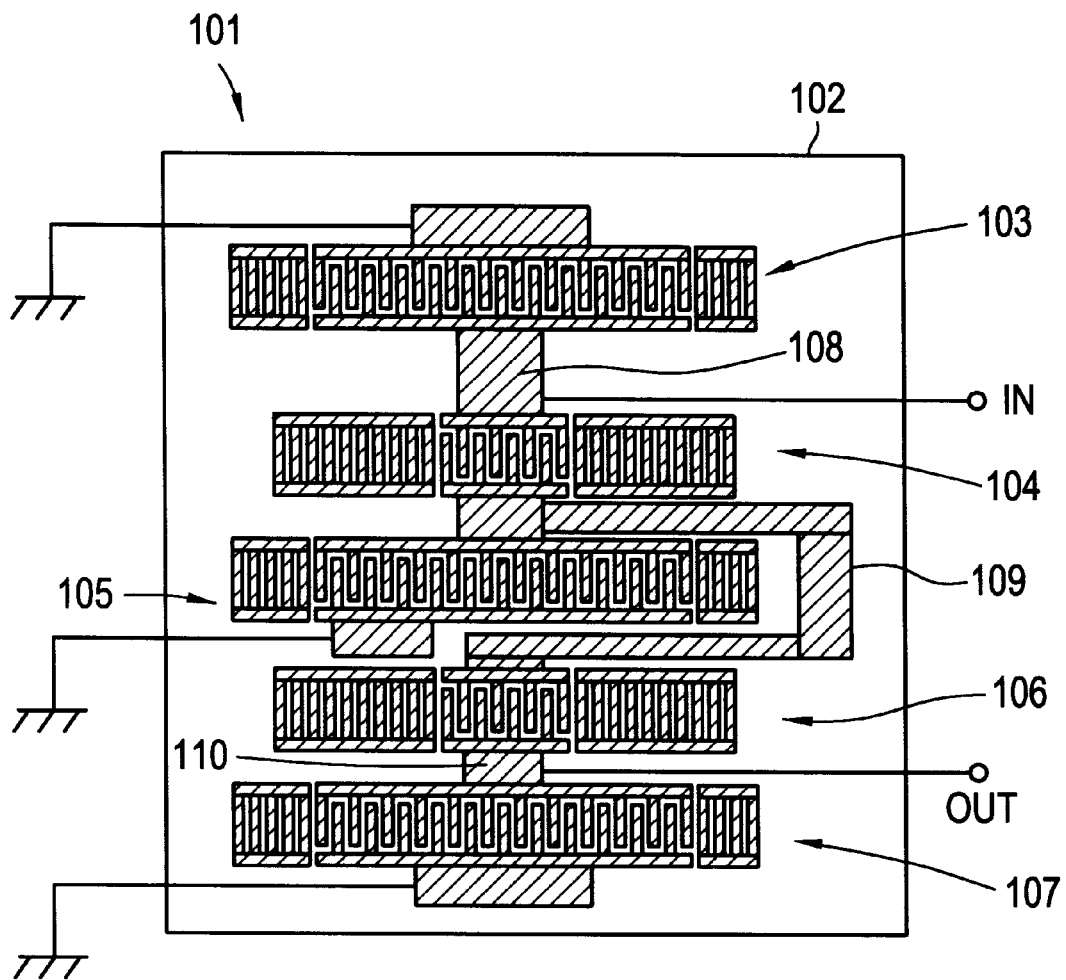
FIG. 28 is a plan view of an SAW filter according to a eight preferred embodiment of the invention.

FIG. 28 is a plan view of a SAW filter according to an eighth preferred embodiment of the present invention. This SAW filter, generally indicated by numeral 101, comprises a surface-wave substrate 102 on which parallel resonators 105, 107 and 103 and series resonators 104 and 106 are arranged. This SAW filter 101 preferably combines the features of both first and second preferred embodiments of the present invention.

Specifically, series resonators 104 and 106 are connected in series between the input terminal IN and the output terminal OUT. The parallel resonators 103, 105, and 107 are connected in parallel between the series arm of the resonators 104, 106 and the ground potential. Connecting electrodes 108, 109, and 110 are provided for connecting the resonators 104–107.

In the present preferred embodiment, the resonators 103–107 are designed preferably using parameters as given in Table 3 below.

TABLE 3

| Resonator | Number of electrode fingers in Reflector | Number of IDT pairs | Overlap width | IDT wavelength | IDT-reflector distance |
|---|---|---|---|---|---|
| SAW resonator 103, 107 | 100 | 50 | 60 | 4.303 | 0.62λ |
| SAW resonator 104, 106 | 100 | 95 | 50 | 4.142 | 0.50λ |
| SAW resonator 105 | 50 | 120 | 120 | 4.327 | 0.43λ |

As can be seen from Table 3, for the series resonators 104 and 106, the distance r from the center of the electrode finger of the reflector which is closest to the IDT, to the center of the electrode finger of the IDT which is closest to the reflector is set to 0.5 λ. On the other hand, for the parallel resonators 103 and 107, the distance r is preferably set to 0.62λ. For the parallel resonator 105, the distance r is preferably set to 0.43λ.

More specifically, the resonator 105 of the resonators 103, 105, and 107 connected in parallel corresponds to the second resonator of the first preferred embodiment. The parallel resonators 103 and 107 correspond to the second resonators of the second preferred embodiment.

Figure 29:
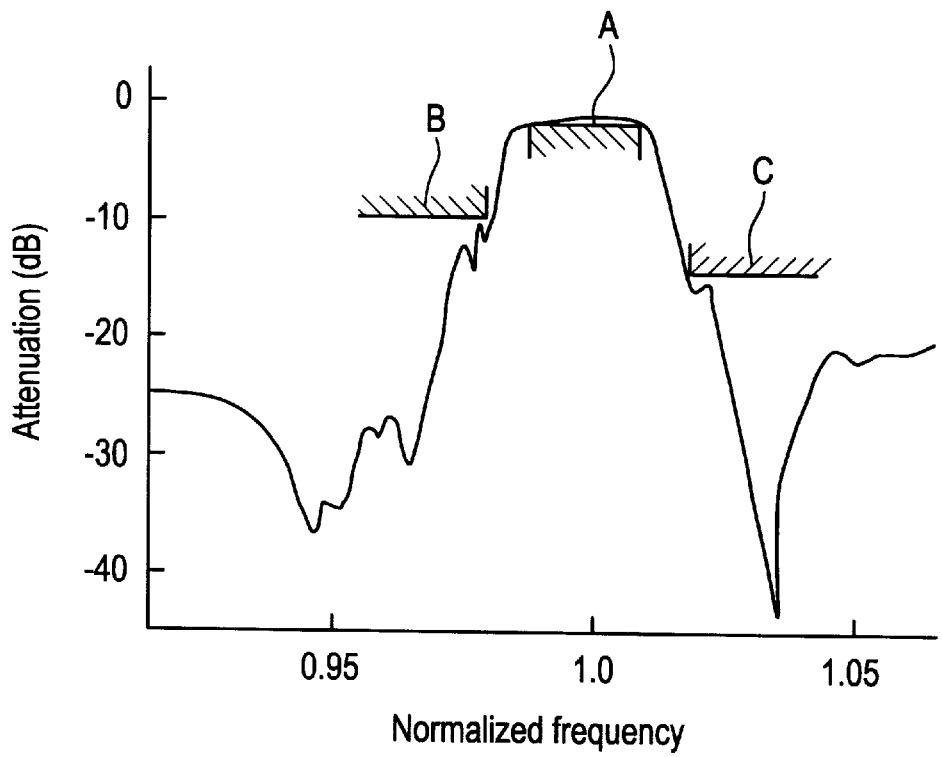
FIG. 29 is a graph illustrating the frequency characteristics of the SAW filter shown in FIG. 28.

The filtering characteristics of the SAW filter 101 according to the present preferred embodiment are shown in FIG. 29. For comparison, the distance r between each interdigital transducer and the adjacent reflector was preferably set to about 0.5λ for all of the SAW resonators 103–107, and the resulting SAW filter characteristics are shown in FIG. 30.

Figure 30:
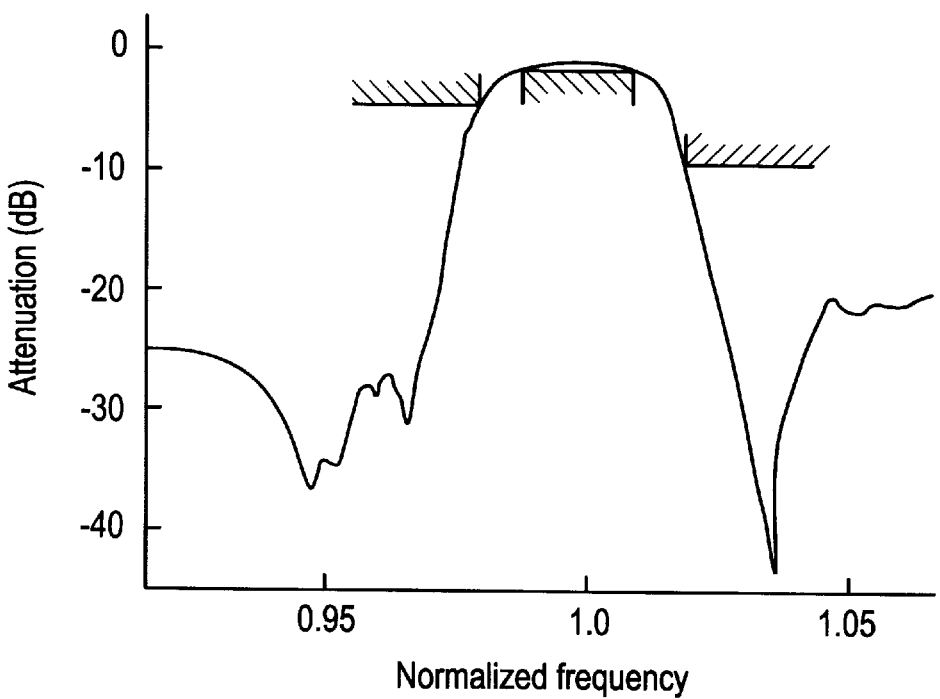
FIG. 30 is a diagram illustrating the frequency characteristics of the SAW filter according to a comparative example for comparison to preferred embodiments of the present invention.

It can be seen by comparing FIG. 29 with FIG. 30 that the frequency response in FIG. 29 and in accordance with preferred embodiments of the present invention is greatly improved to have a very steep inclination and abrupt profile between the stopband and the passband. As a result, the amounts of attenuation at the regions B and C in the stopband are improved by about 5 dB. Therefore, the steepness of the frequency response on both sides of the passband is greatly improved. In consequence, a band-pass filter having excellent selectivity is achieved.

The ninth preferred embodiment of the present invention is directed to a SAW filter device in which a SAW filter according to the first to eighth preferred embodiments is encased in a package.

Figure 31:
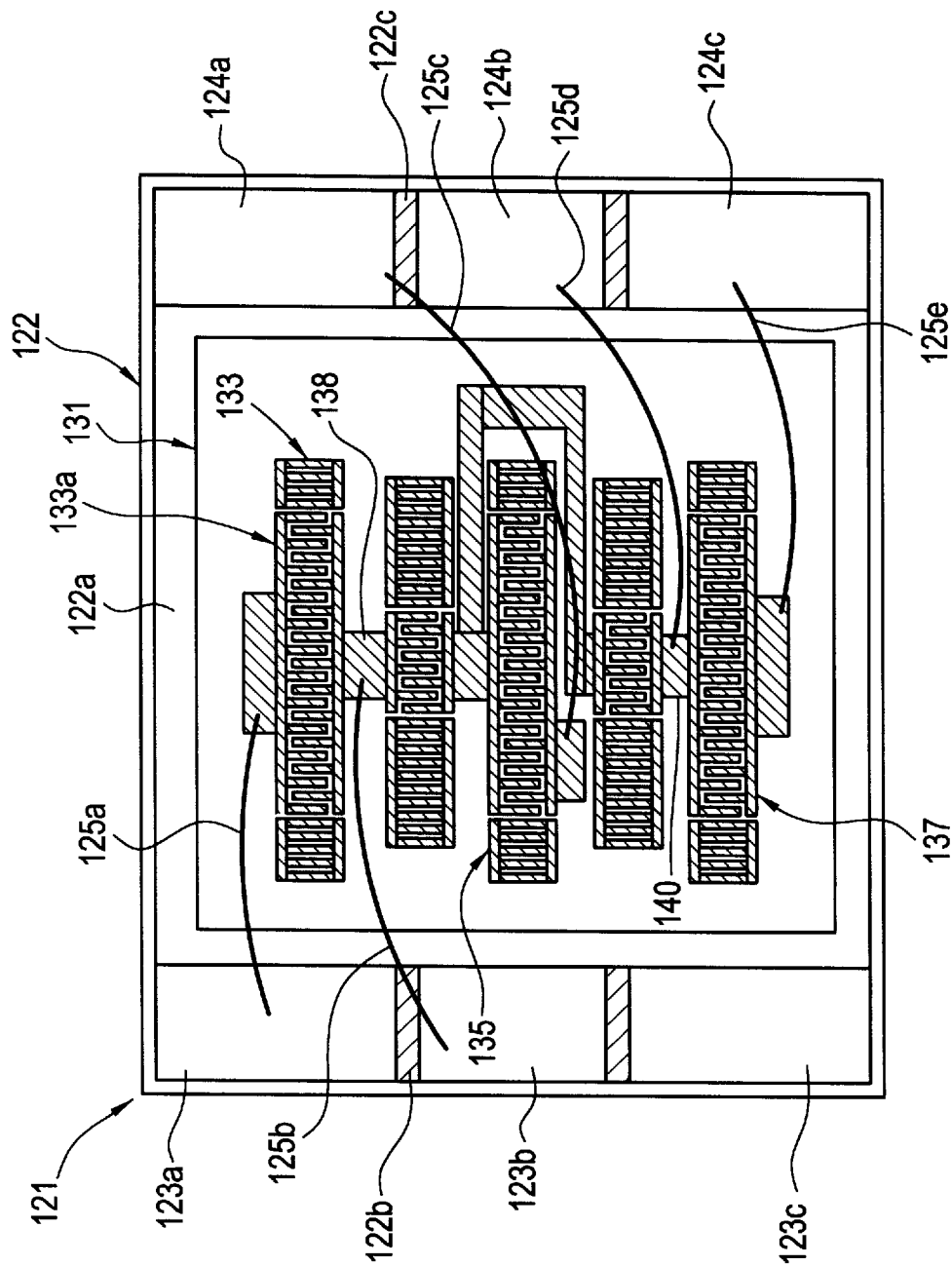
FIG. 31 is a plan view of a SAW filter device according to a comparative example for comparison to preferred embodiments of the present invention.
Figure 32:
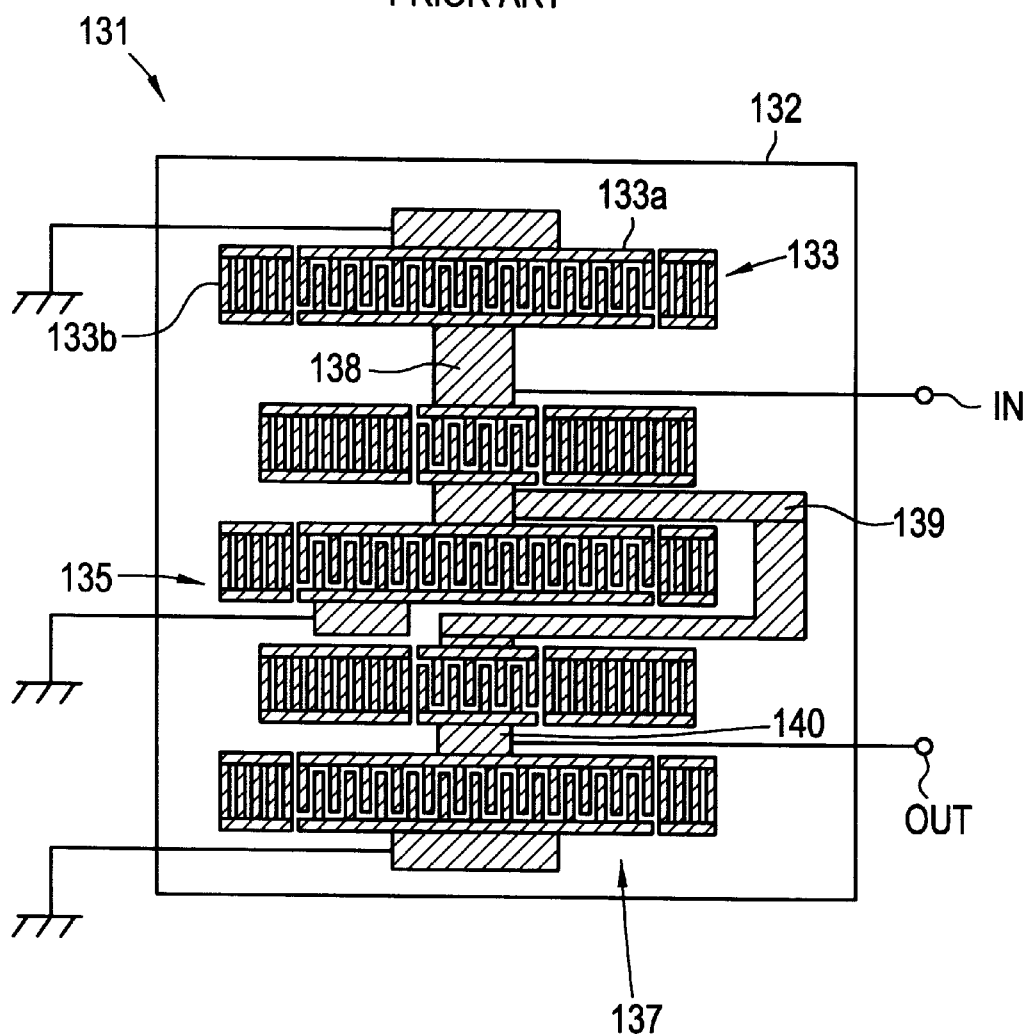
FIG. 32 is a plan view of main part of the SAW filter device shown in FIG. 31.

FIG. 31 is a plan view showing a SAW filter device 121 according to a comparative example made for comparison to the preferred embodiments of the present invention. The SAW filter device 121 has a structure in which a SAW filter 131 shown in FIG. 32 is encased in a package 122 and mounted on a bottom surface 122a of the package 122. In the package 122, step portions 122b and 122c are formed on the both sides of the bottom surface 122a. Electrodes 123a to 123c and 124a to 124c are formed on the step portions 122b and 122c, respectively. The electrodes 123a to 123c and 124a to 124c are electrically connected to outer electrodes (not shown for clarity) on the outside of the package 122.

One of a pair of interdigitated electrodes of an IDT 133a which belongs to a parallel resonator 133 of the SAW filter 131 is electrically connected through a bonding wire 125a to the electrode 123a to be grounded. A connecting electrode 138 is electrically connected to the electrode 123b though a bonding wire 125b. One of a pair of interdigitated electrodes belonging to an IDT of a parallel resonator 135 is electrically connected through a bonding wire 125c to the electrode 124a to be grounded.

Similarly, a connecting electrode 140 is electrically connected to the electrode 124b through a bonding wire 125d. One of a pair of interdigitated electrodes belonging to an IDT of a parallel resonator 137 is electrically connected through a bonding wire 125e to the electrode 124c to be grounded. The electrode 123b is to be connected to an input terminal, and the electrode 124b is to be connected to an output terminal. In summary, the SAW filter 131 is electrically connected the electrodes 123a, 123b and 124a to 124c through the boding wires 125a to 125e.

Figure 33:
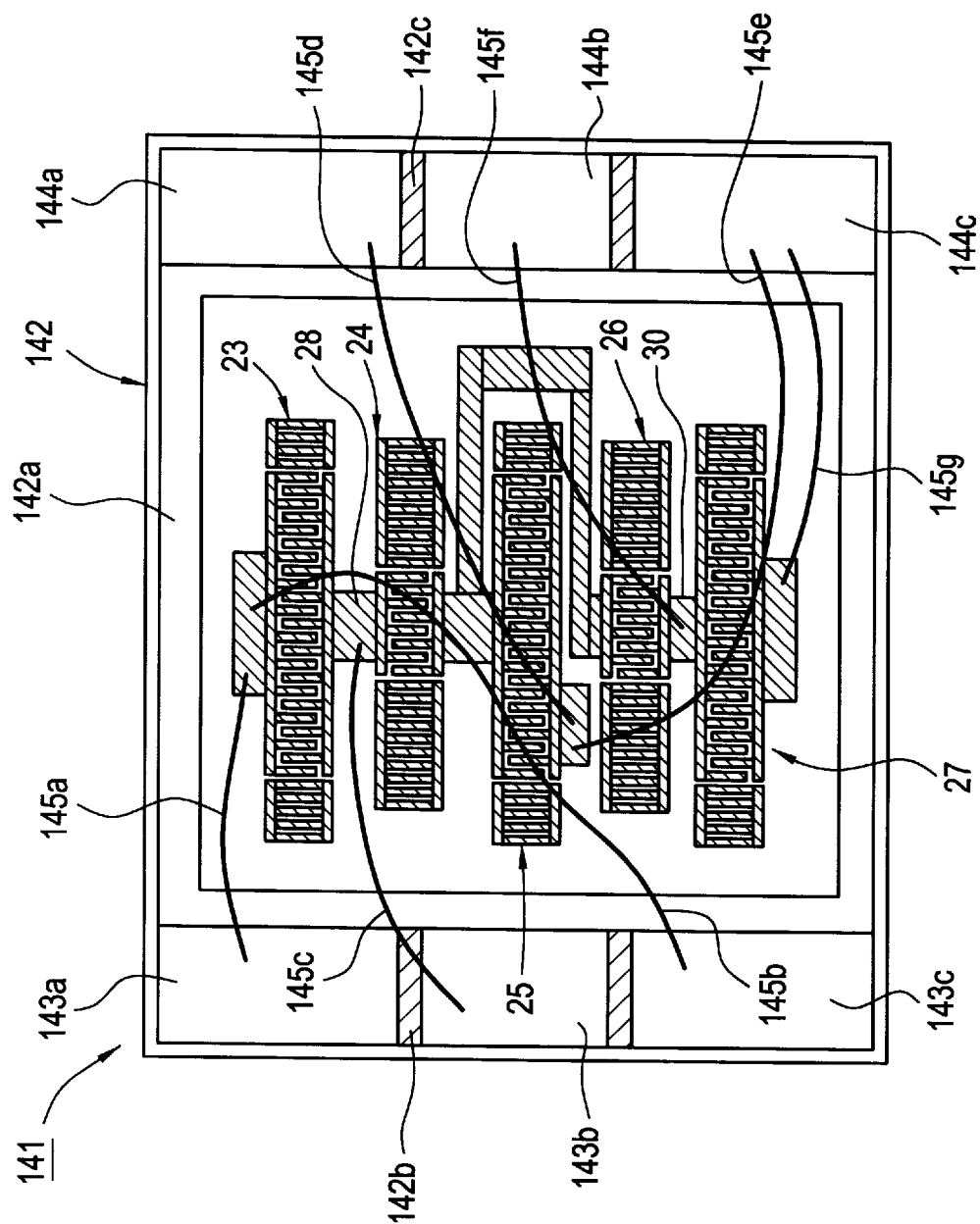
FIG. 33 is a plan view of a SAW filter device according to a ninth preferred embodiment.

On the contrary, FIG. 33 is a plan view showing a SAW filter device 141 according to the present preferred embodiment. In the SAW filter device 141 according to the present preferred embodiment, the SAW filter 21 according to the first preferred embodiment is encased in a package 142. The package 142 has the same structure as that of the package 122. That is, a bottom surface 142a is provided between step portions 142b and 142c which are higher in level than the bottom surface 142a. Electrodes 143a to 143c and 144a to 144c are formed on the step portions 142b and 142c, respectively.

One of a pair of interdigitated electrodes of an IDT belonging to a parallel resonator 23 of the SAW filter 21 is electrically connected to the electrodes 143a and 143c by bonding wires 145a and 145b, respectively. That is, the interdigitated electrode to be grounded is electrically connected through the two bonding wires 145a and 145b to the electrodes 143a and 143c which are to be grounded separately.

On the other hand, the connecting electrode 28 is connected through a bonding wire 145c to the electrode 143b used as an input electrode. A interdigitated electrode which belongs to an IDT of a parallel resonator 25 and is to be grounded is electrically connected through bonding wires 145d and 145e to the electrodes 144a and 144c which are to be grounded, separately.

A connecting electrode 30 is connected through a bonding wire 145f to the electrode 144b used as an output electrode on the package 142. Further, one of a pair of the interdigitated electrodes which belongs to an IDT of a parallel resonator 27 is connected through a bonding wire 145g to the electrode 144c to be grounded.

As is explained in the eighth preferred embodiment, the spurious component causes the impedance peak in the frequency response. The impedance peak becomes great in the case where attenuation is small at the frequency of the spurious component and becomes small in the case where attenuation is great at the frequency of the spurious component. In order to suppress the impedance peak associated with the spurious component, it is therefore preferable that the spurious component is located close to the resonant frequency of the parallel resonator at which the attenuation becomes great.

Although it is possible to place the spurious component at the frequency close to the resonant frequency of the parallel resonator by lowering the spurious component, this adversely makes the spurious component too low to make use of the spurious component for improving the abruptness or steepness of the frequency response. Therefore, it is necessary to increase only the resonant frequency of the parallel resonator.

In the SAW filter device 141 shown in FIG. 33, inductance components associated with the bonding wires or the like are reduced so as to increase the resonant frequency of the parallel resonators 23, 25, and 27. The reason will be explained in more detail below.

Figure 34:
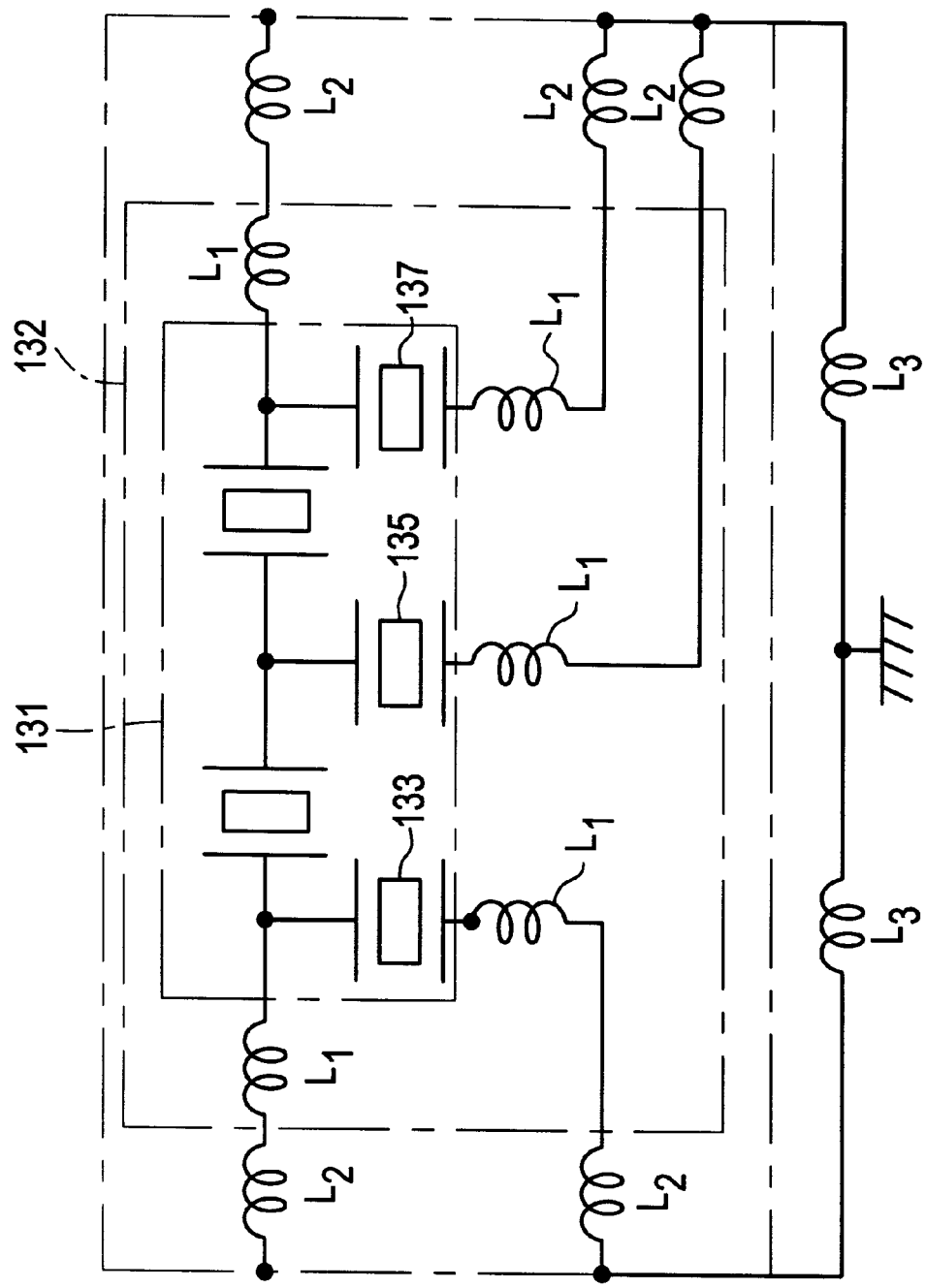
FIG. 34 is an equivalent circuit diagram of the SAW filter device according to the comparative example for comparison to preferred embodiments of the present invention.

FIG. 34 shows an equivalent circuit of the conventional SAW filter shown in FIG. 31. The circuit includes a inductance component associated with the bonding wire or the like. Specifically, the circuit includes an inductance L1 of the bonding wires, a residual inductance L2 of the package 132 and a residual inductance L3 of the electrodes to be grounded. Thus, the total inductance La contributing to the parallel resonators is expressed as follows.

$$La = L1 + L2 + L3 \qquad (1)$$

Figure 35:
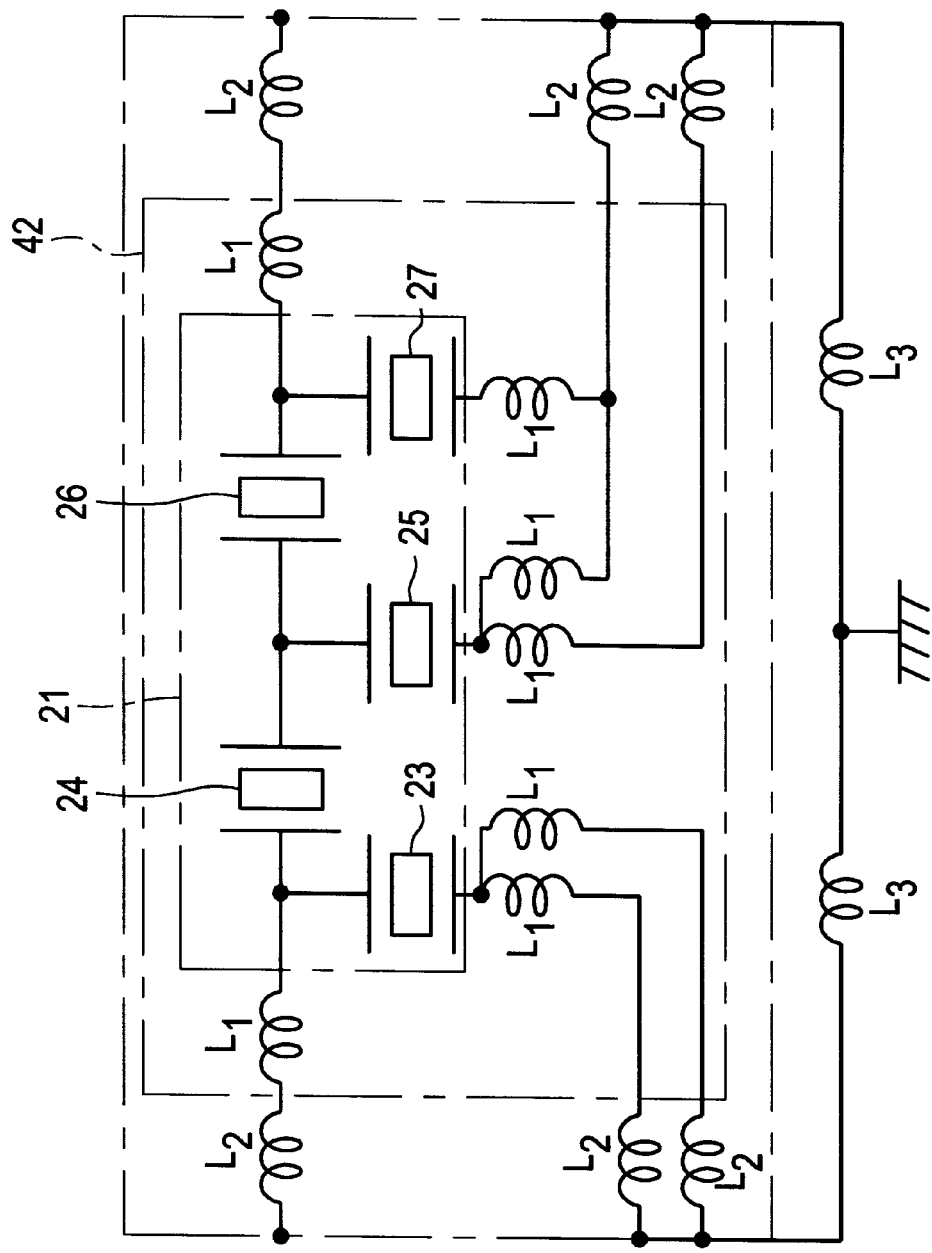
FIG. 35 is an equivalent circuit diagram of the SAW according to the ninth preferred embodiment.

FIG. 35 shows an equivalent circuit of the SAW filter 141 shown in FIG. 33. In the SAW filter 141, the parallel resonators 23 and 25 are grounded separately through the bonding wires 145a, 145b and 145d, 145e, respectively. Therefore, the additional inductance L1 created by the bonding wires and the residual inductance L2 of the package are inserted in parallel to the existing inductances L1 and L2. The total inductance Lb contributing to the parallel resonators 23 and 25 is expressed as follows.

$$Lb = (L1 + L2)/2 + L3 \qquad (2)$$

As is apparent from the equations (1) and (2), the inductance is reduced in the parallel resonators of the SAW filter 141 shown in FIG. 33.

Figure 36:
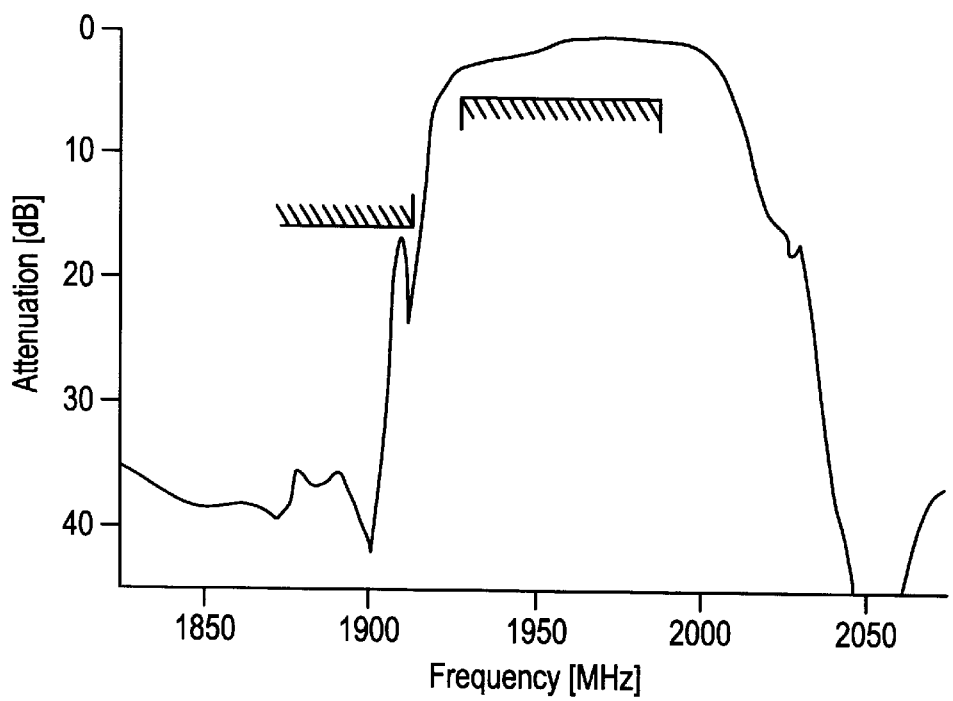
FIG. 36 is a graph showing a frequency response of the SAW filter device according to the comparative embodiment for comparison to preferred embodiments of the present invention.
Figure 37:
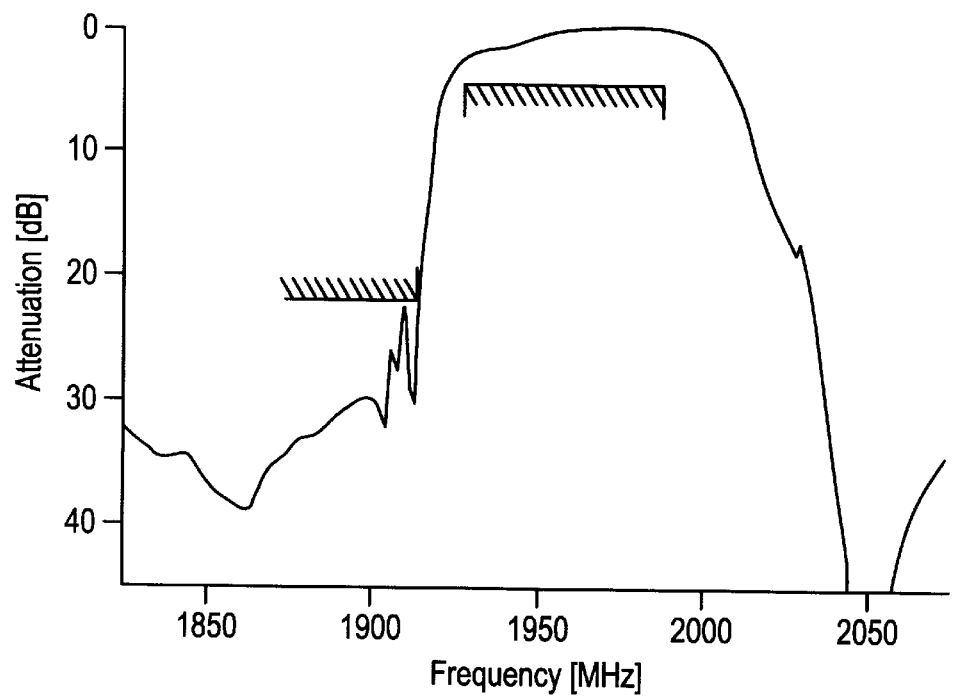
FIG. 37 is a graph showing a frequency response of the SAW filter device according to the ninth preferred embodiment.

FIG. 36 shows the frequency response of the conventional SAW filter device shown in FIG. 31, and FIG. 37 shows the frequency response of the SAW filter device shown in FIG. 33 according to the present preferred embodiment. As shown in FIG. 36, the frequency response produces a steep profile, but there arises an impedance peak Q. As a result, the attenuation in the stopband is limited to about 16 dB.

On the other hand, as shown in FIG. 37, the impedance peak is reduced in the frequency response by increasing the resonant frequency of the parallel resonators. Thus, the attenuation in the stopband is improved by about 6 dB.

Figure 38:
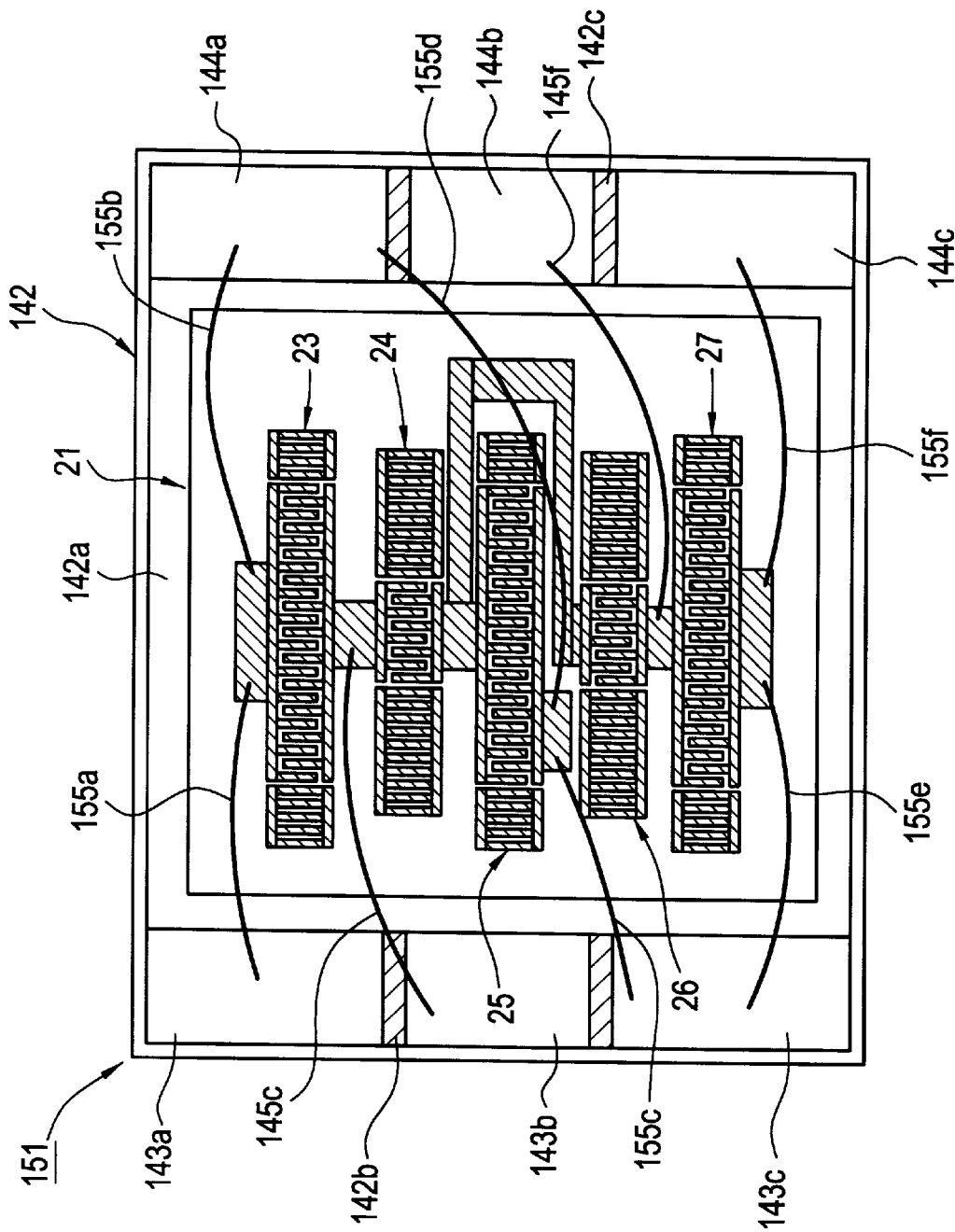
FIG. 38 is a plan view of a SAW filter device according to variation of a ninth preferred embodiment.

FIG. 38 is a plan view of a SAW filter device 151 according to a variation of the present preferred embodiment. In the SAW filter device 151, the SAW filter 21 according to the first preferred embodiment is mounted on a bottom surface 142a of a package 142. One of a pair of interdigitated electrodes belonging to an IDT of a parallel resonator 23 is electrically connected through boding wires 155a and 155b to electrodes 143a and 144a to be grounded, respectively. One of a pair of interdigitated electrodes belonging to an IDT of a parallel resonator 25 is electrically connected through bonding wires 155c and 155d to electrodes 143c and 144a to be grounded. Further, one of a pair of interdigitated electrodes belonging to an IDT of a parallel resonator 27 is electrically connected through bonding wires 155e and 155f to electrodes 143c and 144c to be grounded.

In the SAW filter device 151, the interdigitated electrodes of the parallel resonators 23, 25 and 27 are separately connected through the bonding wires 155a, 155b, 155c, 155d, 155e and 155f to the electrodes to be grounded.

Figure 39:
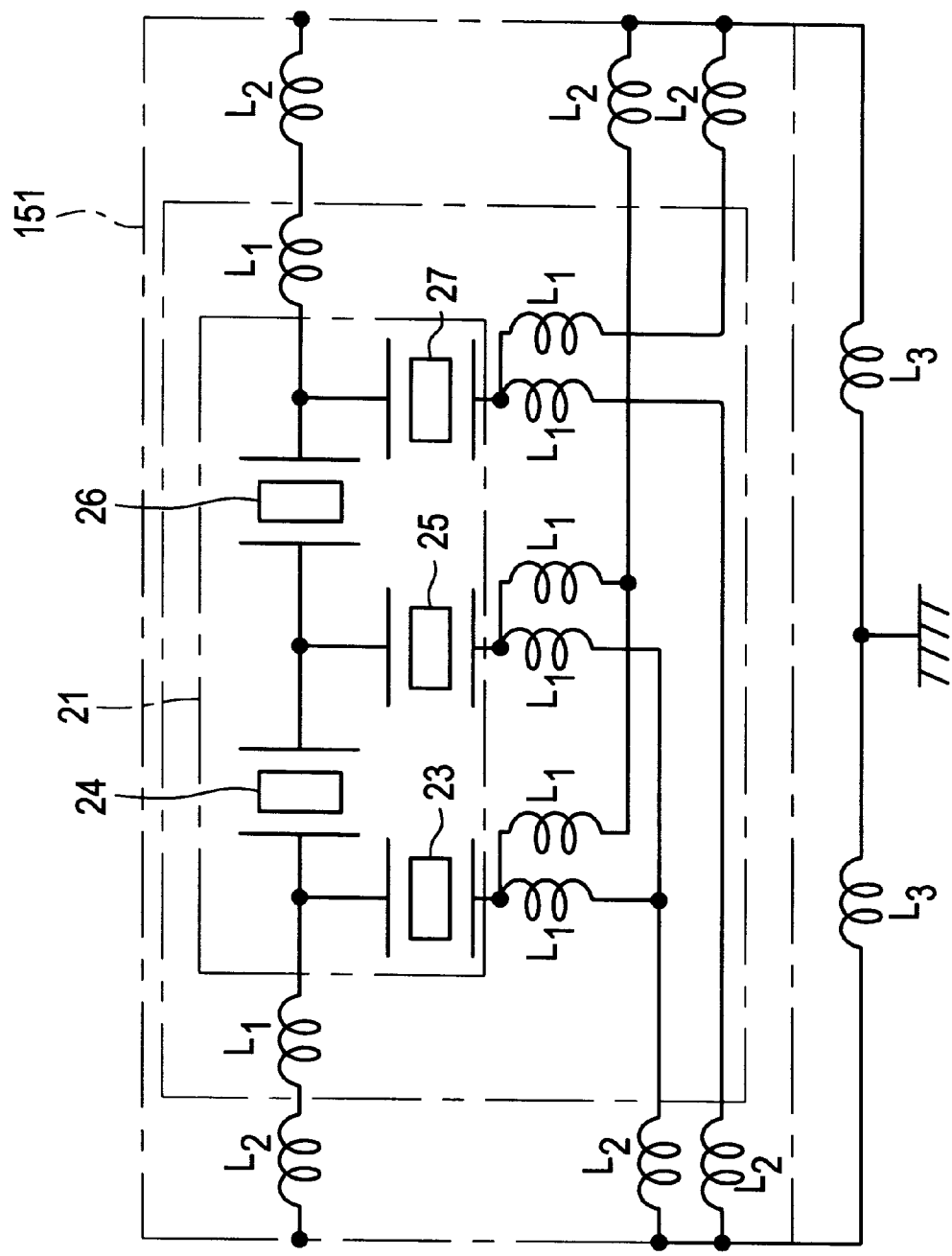
FIG. 39 is an equivalent circuit diagram of the SAW according to the variation of the ninth preferred embodiment.

FIG. 39 is an equivalent circuit of the SAW filter device 151. As shown in FIG. 39, each of the parallel resonators 23, 25 and 27 is grounded through two parallel paths of series inductance L1+l2+L3. Therefore, the inductance Lc contributing to each parallel resonator is expressed by Lc=(L1+L2+L3)/2, and the inductance can be reduced to about half of that in the SAW filter device 121 shown in FIG. 31.

Figure 40:
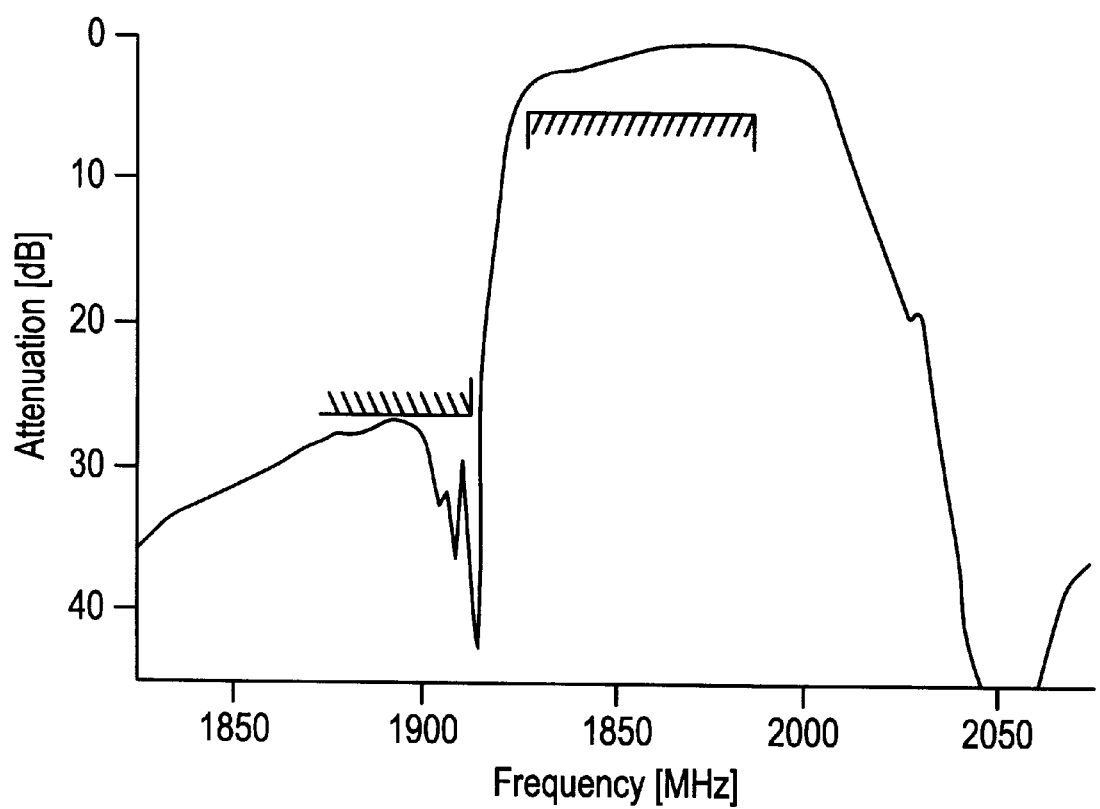
FIG. 40 is a graph showing a frequency response of the SAW filter device according to the variation of the ninth preferred embodiment.

As shown in FIG. 40, the impedance peak is further reduced in the frequency response by increasing the resonant frequency of the parallel resonators. Thus, the attenuation in the stopband is improved by about 10 dB compared to the SAW filter device 121.

Although the SAW filter device according to the present preferred embodiment is based on the SAW filter explained in the first preferred embodiment, it is understood that the SAW filter according to the third, fifth, sixth, seventh and eighth preferred embodiments may be incorporated with the present preferred embodiment.

FIG. 41 is a cross sectional view showing a SAW filter device according to the tenth preferred embodiment of the present invention. The SAW filter device 161 includes a SAW filter 21 according to the first preferred embodiment, a package substrate 162 and a cap 163, and the SAW filter 21 is encased in the internal space 164 created by the package substrate 162 and the cap 163 so that the SAW filter 21 is mounted on the package substrate 162 by a face down method. More specifically, bumps 165a and 165b formed of solder or the like are provided on the electrode pads 167a and 167b which are formed in the SAW filter 21 so as to be electrically connected to an external electrode or the like. The SAW filter 21 is electrically connected to the package substrate 162 by forming solder bumps 165a and 165b in contact with electrodes 166a and 166b in the state that the SAW filter is placed such that the bumps 165a and 165b face downward. It is noted that the electrode pads 167a and 167b are electrodes to be connected to the external and may be interdigitated electrodes or connecting electrodes to be grounded. FIG. 25 shows the SAW filter device including the SAW filter 21, but the SAW filter device according to the present preferred embodiment may include a SAW filter according any one of the third, fifth, sixth, seventh and eighth preferred embodiments.

According to the SAW filter device 161, since the SAW filter 21 is electrically connected to the package substrate 162 not by bonding wires but via the bumps 165a and 165b connected by a face down method, the inductance contributing to the ground side of the parallel resonator is reduced. Therefore, the impedance peak which otherwise appears in the stopband is reduced and suppressed effectively as explained in the ninth preferred embodiment.

In the first to tenth preferred embodiments, two or three parallel resonators and two or three series resonator are used to form a SAW filter having a ladder circuit. However, it is understood that a ladder circuit can be formed by at least one parallel resonator and one series resonator and that frequency response can be improved as explained in the first to tenth preferred embodiments when at least one parallel resonator is incorporated in a SAW filter according to the preferred embodiments of the present invention. It is also understood that SAW filter according to preferred embodiments of the present invention can be formed by more than two or three parallel resonator and more than two or three series resonators although purpose of the present invention is to provide a SAW filter having a good characteristic without increasing number of the stages in the ladder circuit.

While preferred embodiments of the invention have been disclosed, various modes of carrying out the principles disclosed herein are contemplated as being within the scope of the following claims. Therefore, it is understood that the scope of the invention is not to be limited except as otherwise set forth in the claims.

What is claimed is:

1. A surface acoustic wave filter comprising:
   a surface acoustic wave substrate;
   an input terminal;
   an output terminal;
   a ground terminal;
   a series resonator disposed on the surface acoustic wave substrate and having a resonant frequency and an antiresonant frequency, the series resonator being electrically disposed between the input terminal and the output terminal in series so as to define a series arm; and
   a first parallel resonator disposed on the surface acoustic wave substrate having a resonant frequency and an antiresonant frequency which is substantially identical to the resonant frequency of the series resonator, the first parallel resonator being electrically disposed between the series arm and a ground terminal so as to define a first parallel arm, the series arm and the first parallel arm constituting a ladder circuit such that the surface acoustic wave filter has a predetermined pass band;
   wherein the first parallel resonator has a spurious component at a frequency located between the resonant frequency of the first parallel resonator and a low end of the passband of the surface acoustic wave filter or at a frequency located between the antiresonant frequency of the series resonator and a high end of the passband of the surface acoustic wave filter.

2. A surface acoustic wave filter according to claim 1, wherein the first parallel resonator comprises a one-port type surface acoustic wave resonator.

3. A surface acoustic wave filter according to claim 1, wherein the first parallel resonator comprises:
   an interdigital transducer disposed on the surface acoustic wave substrate and having a plurality of electrode fingers; and
   a pair of reflectors arranged on the surface acoustic wave substrate such that the interdigital transducer is sandwiched between the pair of reflectors, each of the reflectors having a plurality of electrode fingers, and
   wherein one of the interdigital transducers and the pair of the reflectors is arranged so that the first parallel resonator has a spurious component at a frequency located between the resonant frequency of the first parallel resonator and the low end of the passband of the surface acoustic wave filter.

4. A surface acoustic wave filter according to claim 3, wherein a distance from a center of the electrode finger of the reflector which is closest to the interdigital transducer, to a center of the electrode finger of the interdigital transducer which is closest to the reflector is less than $0.5\lambda$, where $\lambda$ is a wavelength of a surface acoustic wave to be excited on the surface acoustic wave substrate.

5. A surface acoustic wave filter according to claim 3, wherein a width of the electrode finger of the interdigital transducer which is closest to the reflector is smaller than that of the remaining electrode fingers of the interdigital transducer.

6. A surface acoustic wave filter according to claim 3, wherein a width of the electrode finger of the reflector which is closest to the interdigital transducer is smaller than that of the remaining electrode fingers of the reflector.

7. A surface acoustic wave filter according to claim 3, wherein a pitch between the electrode fingers of the reflector is smaller than that of the interdigital transducer so that the spurious component is located outside of a stopband of the reflector of the parallel resonator.

8. A surface acoustic wave filter according to claim 3, further comprising:
   a package for encasing the surface acoustic wave substrate;
   a plurality of electrodes disposed on the package; and
   a plurality of bonding wires; wherein
   the plurality of the electrode fingers of the first parallel resonator constitute a pair of interdigitated electrodes, and one of the interdigitated electrodes is electrically connected to at least one of the electrodes on the package through the bonding wires.

9. A surface acoustic wave filter according to claim 8, wherein the bonding wires are connected to different ones of the electrodes on the package, respectively.

10. A surface acoustic wave filter according to claim 3, further comprising:
    a package for encasing the surface acoustic wave substrate; and
    a plurality of electrodes disposed inside the package; wherein
    the first parallel resonator includes a plurality of bumps disposed on the interdigital transducer and the surface acoustic wave substrate is encased in the package such that the bumps are in contact with the electrodes disposed inside the package.

11. A surface acoustic wave filter according to claim 1, further comprising a second parallel resonator disposed on the surface acoustic wave substrate having a resonant frequency and an antiresonant frequency which is substantially identical to the resonant frequency of the series resonator, the second parallel resonator being electrically disposed between the series arm and the ground terminal so as to define a second parallel arm, the series arm and the first and second parallel arms constituting the ladder of the ladder type circuit;
    wherein the second parallel resonator has a spurious component at a frequency located between the antiresonant frequency of the series resonator and the high end of the passband of the surface acoustic wave filter.

12. A surface acoustic wave filter according to claim 1, wherein the first parallel resonator comprises:
    an interdigital transducer arranged on the surface acoustic wave substrate and having a plurality of electrode fingers; and
    a pair of reflectors arranged on the surface acoustic wave substrate such that the interdigital transducer is sandwiched between the pair of reflectors, each of the reflectors having a plurality of electrode fingers, and
    wherein the one of the interdigital transducer and the pair of the reflectors is arranged so that the first parallel resonator has a spurious component at a frequency between the antiresonant frequency of the series resonator and the high end of the passband of the surface acoustic wave filter.

13. A surface acoustic wave filter according to claim 12, wherein a distance from a center of the electrode finger of the reflector which is closest to the interdigital transducer, to a center of the electrode finger of the interdigital transducer which is closest to the reflector is greater than $0.5\lambda$, where $\lambda$ is a wavelength of a surface acoustic wave to by excited on the surface acoustic wave substrate.

14. A surface acoustic wave filter according to claim 12, wherein a width of the electrode finger of the interdigital transducer which is closest to the reflector is greater than that of the remaining electrode fingers of the interdigital transducer.

15. A surface acoustic wave filter according to claim 12, wherein a width of the electrode finger of the reflector which is closest to the interdigital transducer is greater than that of the remaining electrode fingers of the reflector.

16. A surface acoustic wave filter according to claim 12, wherein a pitch between the electrode fingers of the reflector is greater than that of the interdigital transducer so that the spurious component locates out of a stopband of the reflector of the parallel resonator.

17. A surface acoustic wave filter comprising:

a surface acoustic wave substrate;

a series resonator disposed on the surface acoustic wave substrate and having a resonant frequency and an antiresonant frequency, the series resonator being arranged to define a series arm; and at least one parallel resonator disposed on the surface acoustic wave substrate having a resonant frequency and an antiresonant frequency which is substantially identical to the resonant frequency of the series resonator, the at least one parallel resonator being arranged to define a parallel arm, the series arm and the parallel arm defining a ladder circuit such that the surface acoustic wave filter has a predetermined pass band;

wherein the at least one parallel resonator has a spurious component at a frequency located between the resonant frequency of the at least parallel resonator and a low end of the passband of the surface acoustic wave filter or at a frequency located between the antiresonant frequency of the series resonator and a high end of the passband of the surface acoustic wave filter.

18. A surface acoustic wave filter according to claim 17, wherein the at least one parallel resonator comprises a one-port type surface acoustic wave resonator.

19. A surface acoustic wave filter according to claim 17, wherein the at least one parallel resonator comprises:

an interdigital transducer disposed on the surface acoustic wave substrate and having a plurality of electrode fingers; and a pair of reflectors arranged on the surface acoustic wave substrate such that the interdigital transducer is sandwiched between the pair of reflectors, each of the reflectors having a plurality of electrode fingers, and wherein one of the interdigital transducers and the pair of the reflectors is arranged so that the at least one parallel resonator has a spurious component at a frequency located between the resonant frequency of the at least one parallel resonator and the low end of the passband of the surface acoustic wave filter.

20. A ladder type filter comprising:

a surface acoustic wave substrate;

a series resonator disposed on the surface acoustic wave substrate and being arranged to define a series arm; and at least one parallel resonator disposed on the surface acoustic wave substrate and being arranged to define a parallel arm, the series arm and the parallel arm defining a ladder circuit such that the surface acoustic wave filter has a predetermined pass band; wherein the at least one parallel resonator has a spurious component at a frequency located between a resonant frequency of the at least one parallel resonator and a low end of the passband of the surface acoustic wave filter or at a frequency located between an antiresonant frequency of the series resonator and a high end of the passband of the surface acoustic wave filter.

* * * * *